(12) United States Patent
Kim et al.

(10) Patent No.: US 12,424,984 B2
(45) Date of Patent: Sep. 23, 2025

(54) POWER AMPLIFICATION CIRCUIT INCLUDING PROTECTION CIRCUIT AND ELECTRONIC DEVICE INCLUDING POWER AMPLIFICATION CIRCUIT

(71) Applicant: Samsung Electronics Co., Ltd., Gyeonggi-do (KR)

(72) Inventors: Jungjoon Kim, Gyeonggi-do (KR); Hyunseok Choi, Gyeonggi-do (KR); Yunsu Jin, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 463 days.

(21) Appl. No.: 17/720,535

(22) Filed: Apr. 14, 2022

(65) Prior Publication Data

US 2022/0337201 A1    Oct. 20, 2022

Related U.S. Application Data

(63) Continuation of application No. PCT/KR2022/005305, filed on Apr. 12, 2022.

(30) Foreign Application Priority Data

Apr. 14, 2021  (KR) .................. 10-2021-0048806

(51) Int. Cl.
  *H03F 1/52*   (2006.01)
  *H03F 3/24*   (2006.01)
  *H04B 1/04*   (2006.01)

(52) U.S. Cl.
  CPC ............... *H03F 1/52* (2013.01); *H03F 3/245* (2013.01); *H04B 1/04* (2013.01);
  (Continued)

(58) Field of Classification Search
  CPC ...... H03F 1/52; H03F 3/245; H03F 2200/426; H03F 2200/451; H03F 2200/294;
  (Continued)

(56) References Cited

U.S. PATENT DOCUMENTS 10,141,227 B1    11/2018  Suarez et al.
10,348,254 B2 *   7/2019  Wang .................... H03F 3/195
(Continued)

FOREIGN PATENT DOCUMENTS

CN    107852167    3/2018
CN    107911084    4/2018
(Continued)

OTHER PUBLICATIONS

International Search Report dated Jul. 22, 2022 issued in counterpart application No. PCT/KR2022/005305, 8 pages.
(Continued)

*Primary Examiner* — Ankur Jain
(74) *Attorney, Agent, or Firm* — The Farrell Law Firm, P.C.

(57) ABSTRACT

A power amplification circuit may comprise a power distributor configured to receive a radio frequency (RF) signal and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, and a protection circuit configured to identify a current input to a bias terminal of the second power amplifier and, control a magnitude of the current input to the bias terminal based on the identified input current.

20 Claims, 18 Drawing Sheets

(52) U.S. Cl.
CPC .. *H03F 2200/426* (2013.01); *H03F 2200/451* (2013.01); *H04B 2001/045* (2013.01)

(58) Field of Classification Search
CPC .......... H03F 1/0288; H03F 3/19; H04B 1/04; H04B 2001/045
See application file for complete search history.

(56) References Cited

U.S. PATENT DOCUMENTS

| | | | |
|---|---|---|---|
| 2007/0229165 A1* | 10/2007 | Elmala | H03F 1/0288 |
| | | | 330/286 |
| 2009/0170454 A1 | 7/2009 | Hug et al. | |
| 2010/0052779 A1 | 3/2010 | Shin et al. | |
| 2011/0095827 A1 | 4/2011 | Tanaka et al. | |
| 2014/0340155 A1 | 11/2014 | Berndsen et al. | |
| 2016/0006395 A1 | 1/2016 | Kim et al. | |
| 2016/0036395 A1 | 2/2016 | Quaglietta | |
| 2016/0211805 A1 | 7/2016 | Otake | |
| 2017/0026008 A1* | 1/2017 | Hong | H03F 1/0261 |
| 2017/0141741 A1 | 5/2017 | Quaglietta | |
| 2017/0155364 A1 | 6/2017 | Zhang et al. | |
| 2018/0006611 A1 | 1/2018 | de Jong et al. | |
| 2018/0109229 A1 | 4/2018 | Ma et al. | |
| 2018/0262162 A1* | 9/2018 | Lyalin | H03F 1/0288 |
| 2018/0316311 A1 | 11/2018 | Gebeyehu et al. | |
| 2018/0351567 A1 | 12/2018 | Grewing | |
| 2020/0052653 A1 | 2/2020 | Thoma | |
| 2021/0141408 A1 | 5/2021 | Yasusaka | |

FOREIGN PATENT DOCUMENTS

| | | |
|---|---|---|
| JP | 2020-516194 | 5/2020 |
| JP | 2021-018657 | 2/2021 |
| KR | 1020050105583 | 11/2005 |
| KR | 1020160005431 | 1/2016 |
| KR | 10-1936664 | 1/2019 |
| KR | 1020200003058 | 1/2020 |
| KR | 10-2178035 | 11/2020 |

OTHER PUBLICATIONS

Korean Office Action dated Jun. 30, 2025 issued in counterpart application No. 10-2021-0048806, 12 pages.

* cited by examiner

POWER AMPLIFICATION CIRCUIT INCLUDING PROTECTION CIRCUIT AND ELECTRONIC DEVICE INCLUDING POWER AMPLIFICATION CIRCUIT

CROSS-REFERENCE TO RELATED APPLICATION(S)

This application is a continuation application, claiming priority under § 365(c), of an International application No. PCT/KR2022/005305, filed on Apr. 12, 2022, which is based on and claims the benefit of a Korean patent application number 10-2021-0048806, filed on Apr. 14, 2021, in the Korean Intellectual Property Office, the disclosure of which is incorporated by reference herein in its entirety.

BACKGROUND

1. Field

The disclosure relates to a power amplification circuit including a protection circuit, and an electronic device including the power amplification circuit.

2. Description of Related Art

Various types of electronic devices that transmit and receive radio frequency (RF) signals may include at least one power amplifier (PA) to amplify the RF signals.

A power amplifier may be implemented in various ways to reduce current consumption. For example, the power amplifier may reduce the current consumption of the PA by applying an envelope tracking (ET) mode. As alternatives, an average power tracking (APT) mode, which uses a power management integrated circuit (PMIC), and structures for reducing current consumption by the PA alone are being researched.

For example, a power amplification circuit for amplifying a radio frequency (RF) signal may include a plurality of power amplifiers. When the plurality of power amplifiers are connected in parallel, at least one of the plurality of power amplifiers may be damaged.

SUMMARY

According to various embodiments, there may be provided a power amplification circuit including a protection circuit and an electronic device including the power amplification circuit, in which the power amplification circuit includes a plurality of power amplifiers connected in parallel and having different biases set therefor, and the protection circuit is able to protect over current for each power amplifier.

According to various embodiments, there may be provided a power amplification circuit and an electronic device including the power amplification circuit, in which the power amplification circuit includes a plurality of power amplifiers connected in parallel and having different biases set therefor and, when an over current occurs, the gain of the bias voltage may be adjusted for each power amplifier.

According to various embodiments, there may be provided a power amplification circuit including a monitoring circuit and an electronic device including the power amplification circuit, in which the power amplification circuit includes a plurality of power amplifiers connected in parallel and having different biases set therefor, and the monitoring circuit is able to monitor damage for each power amplifier.

According to an embodiment, a power amplification circuit may comprise a power distributor configured to receive a radio frequency (RF) signal and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, and a protection circuit configured to identify a current input to a bias terminal of the second power amplifier and, control a magnitude of the current input to the bias terminal based on the identified input current.

According to an embodiment, a power amplification circuit may comprise a power distributor configured to receive a radio frequency (RF) signal and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, a resistor connected to a bias terminal of the second power amplifier, and a monitoring circuit configured to determine whether the second power amplifier is damaged based on a current measured between both ends of the resistor.

According to an embodiment, an electronic device may comprise a communication processor, an RF circuit configured to modulate a baseband signal output from the communication processor into a radio frequency (RF) signal and output the RF signal, a power distributor configured to receive the RF signal from the RF circuit and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, and a protection circuit configured to identify a current input to a bias terminal of the second power amplifier and, control a magnitude of the current input to the bias terminal based on the identified input current.

According to various embodiments, in the power amplification circuit including a plurality of power amplifiers connected in parallel and having different biases set therefor, the protection circuit may be included in each power amplifier. Thus, it is possible to protect each power amplifier from damage.

According to various embodiments, in the power amplification circuit including a plurality of power amplifiers connected in parallel and having different biases set therefor, the gain of the bias voltage is adjusted for each power amplifier when an overcurrent occurs. Thus, it is possible to prevent a recurrence of overcurrent.

According to various embodiments, in the power amplification circuit including a plurality of power amplifiers connected in parallel and having different biases set therefor, damage is monitored for each power amplifier. Thus, it may be identified which power amplifier has been damaged. A recurrence of damage may be reduced by adjusting an overcurrent reference for the power amplifier.

BRIEF DESCRIPTION OF THE DRAWINGS

The above and other aspects, features, and advantages of various embodiments will be more apparent from the following description taken in conjunction with the accompanying drawings, in which.

DETAILED DESCRIPTION

Figure 1:
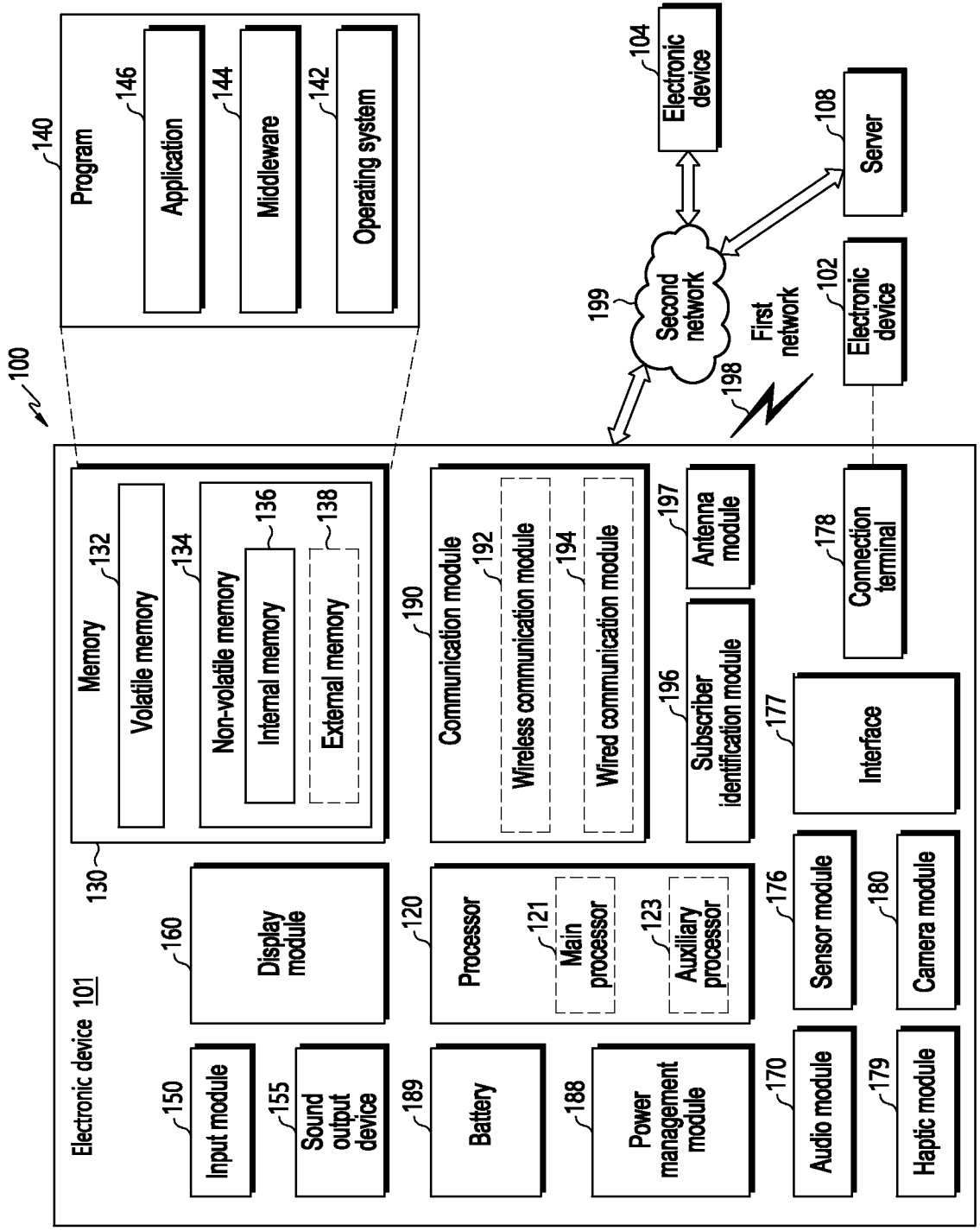
FIG. 1 is a view illustrating an electronic device in a network environment according to various embodiments.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

With regard to description of the drawings, identical or similar reference numerals may be used to refer to identical or similar components.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a fifth generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beamforming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
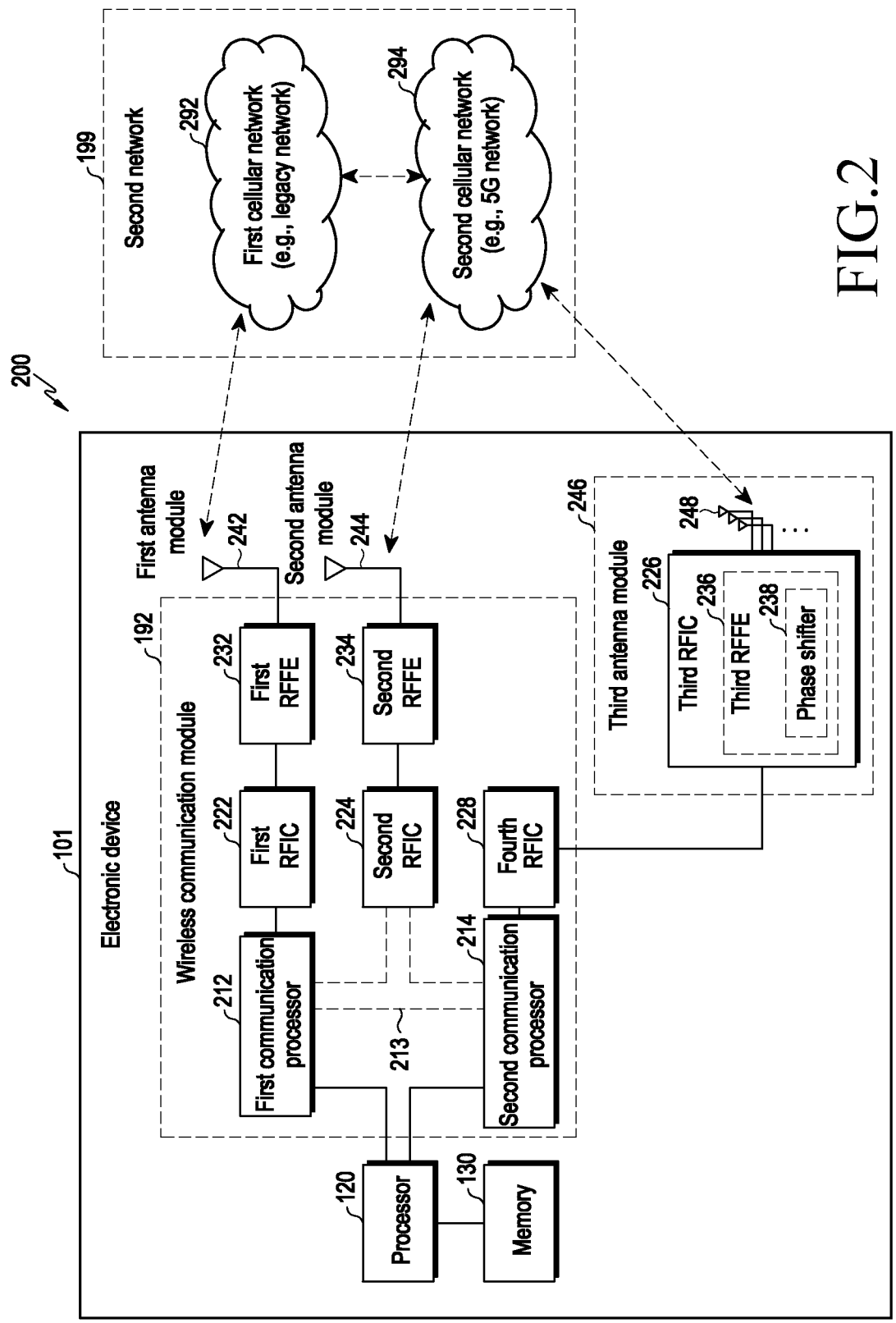
FIG. 2 is a block diagram illustrating an electronic device in a network environment including a plurality of cellular networks according to various embodiments.

FIG. 2 is a block diagram 200 of an electronic device 100 in a network environment including a plurality of cellular networks according to an embodiment.

Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. The second network 199 may include a first cellular network 292 and a second cellular network 294. According to an embodiment, the electronic device 101 may further include at least one component among the components of FIG. 1, and the second network 199 may further include at least one other network. According to an embodiment, the first communication processor (CP) 212, the second CP 214, the first RFIC 222, the second RFIC 224, the fourth RFIC 228, the first RFFE 232, and the second RFFE 234 may form at least part of the wireless communication module 192. According to an embodiment, the fourth RFIC 228 may be omitted or be included as part of the third RFIC 226.

The first CP 212 may establish a communication channel of a band that is to be used for wireless communication with the first cellular network 292 or may support legacy network communication via the established communication channel. According to an embodiment, the first cellular network may be a legacy network that includes second generation (2G), third generation (3G), 4G, or long-term evolution (LTE) networks. The second CP 214 may establish a communication channel corresponding to a designated band (e.g., from about 6 GHz to about 60 GHz) among bands that are to be used for wireless communication with the second cellular network 294 or may support 5G network communication via the established communication channel. According to an embodiment, the second cellular network 294 may be a 5G network defined by the 3rd generation partnership project (3GPP). Additionally, the first CP 212 or the second CP 214 may establish a communication channel corresponding to another designated band (e.g., about 6 GHz or less) among the bands that are to be used for wireless communication with the second cellular network 294 or may support 5G network communication via the established communication channel.

According to an embodiment, the first CP 212 and the second CP 214 may be implemented in a single chip or a single package. According to an embodiment, the first CP 212 or the second CP 214, along with the processor 120, an assistance processor 123, or communication module 190, may be formed in a single chip or single package. According to an embodiment, the first CP 212 and the second CP 214 may be connected together directly or indirectly by an interface (not shown) to provide or receive data or control signals unilaterally or bi-laterally.

According to implementation, the first communication processor 212 may not be directly connected with the second communication processor 214. In this case, the first communication processor 212 may transmit/receive data to/from the second communication processor 214 via a processor 120 (e.g., an application processor). For example, the first communication processor 212 and the second communication processor 214 may transmit/receive data to/from the processor 120 (e.g., an application processor) via a high speed-universal asynchronous receiver-transmitter (HS-UART) interface or peripheral component interconnect express (PCIe) interface, but the kind of the interface is not limited thereto. The first communication processor 212 and the second communication processor 214 may exchange control information and packet data information with the processor 120 (e.g., an application processor) using a shared memory.

Upon transmission, the first RFIC 222 may convert a baseband signal generated by the first CP 212 into a radio frequency (RF) signal with a frequency ranging from about 700 MHz to about 3 GHz, which is used by the first cellular network 292 (e.g., a legacy network). Upon receipt, the RF signal may be obtained from the first cellular network 292 (e.g., a legacy network) through an antenna (e.g., the first antenna module 242) and be pre-processed via an RFFE (e.g., the first RFFE 232). The first RFIC 222 may convert the pre-processed RF signal into a baseband signal that may be processed by the first CP 212.

Upon transmission, the second RFIC 224 may convert the baseband signal generated by the first CP 212 or the second CP 214 into a Sub6-band (e.g., about 6 GHz or less) RF signal (hereinafter, "5G Sub6 RF signal") that is used by the second cellular network 294 (e.g., a 5G network). Upon receipt, the 5G Sub6 RF signal may be obtained from the second cellular network 294 (e.g., a 5G network) through an antenna (e.g., the second antenna module 244) and be pre-processed via an RFFE (e.g., the second RFFE 234). The second RFIC 224 may convert the pre-processed 5G Sub6 RF signal into a baseband signal that may be processed by a corresponding processor of the first CP 212 and the second CP 214.

The third RFIC 226 may convert the baseband signal generated by the second communication processor 214 into a 5G Above6 band (e.g., about 6 GHz to about 60 GHz) RF signal (hereinafter, "5G Above6 RF signal") that is to be used by the second cellular network 294 (e.g., a 5G network). Upon receipt, the 5G Above6 RF signal may be obtained from the second cellular network 294 (e.g., a 5G network) through an antenna (e.g., the antenna 248) and be pre-processed via the third RFFE 236. The third RFIC 226 may convert the pre-processed 5G Above6 RF signal into a baseband signal that may be processed by the second CP 214. The third RFFE 236 may be formed as part of the third RFIC 226.

The electronic device 101 may include the fourth RFIC 228 separately from, or as at least part of, the third RFIC 226. In this case, the fourth RFIC 228 may convert the baseband signal generated by the second CP 214 into an intermediate frequency band (e.g., from about 9 GHz to about 11 GHz) RF signal (hereinafter, "IF signal") and transfer the IF signal to the third RFIC 226. The third RFIC 226 may convert the IF signal into a 5G Above6 RF signal. Upon receipt, the 5G Above6 RF signal may be received from the second cellular network 294 (e.g., a 5G network) through an antenna (e.g., the antenna 248) and be converted into an IF signal by the third RFIC 226. The fourth RFIC 228 may convert the IF signal into a baseband signal that may be processed by the second CP 214.

The first RFIC 222 and the second RFIC 224 may be implemented as at least part of a single chip or single package. The first RFFE 232 and the second RFFE 234 may be implemented as at least part of a single chip or single package. At least one of the first antenna module 242 or the second antenna module 244 may be omitted or be combined with another antenna module to process multi-band RF signals.

The third RFIC 226 and the antenna 248 may be disposed on the same substrate to form the third antenna module 246. For example, the wireless communication module 192 or the processor 120 may be disposed on a first substrate (e.g., a main painted circuit board (PCB)). In this case, the third RFIC 226 and the antenna 248, respectively, may be disposed on one area (e.g., the bottom) and another (e.g., the top) of a second substrate (e.g., a sub PCB), which is provided separately from the first substrate, forming the third antenna module 246.

Placing the third RFIC 226 and the antenna 248 on the same substrate may shorten the length of the transmission line therebetween. This may reduce a loss (e.g., attenuation) of high-frequency band (e.g., from about 6 GHz to about 60 GHz) signal used for 5G network communication due to the transmission line. Thus, the electronic device 101 may enhance the communication quality with the second cellular network 294 (e.g., a 5G network).

The antenna 248 may be formed as an antenna array which includes a plurality of antenna elements available for beamforming. In this case, the third RFIC 226 may include a plurality of phase shifters 238 corresponding to the plurality of antenna elements, as part of the third RFFE 236. Upon transmission, the plurality of phase shifters 238 may change the phase of the 5G Above6 RF signal which is to be transmitted to the outside (e.g., a 5G network base station) of the electronic device 101 via their respective corresponding antenna elements. Upon receipt, the plurality of phase shifters 238 may change the phase of the 5G Above6 RF signal received from the outside to the same or substantially the same phase via their respective corresponding antenna elements. This enables transmission or reception via beamforming between the electronic device 101 and the outside.

The second cellular network 294 (e.g., a 5G network) may be operated independently (e.g., as standalone (SA)) from, or in connection (e.g., as non-standalone (NSA)) with the first cellular network 292 (e.g., a legacy network). For example, the 5G network may include access networks (e.g., 5G access networks (RANs)) but lack any core network (e.g., a next-generation core (NGC)). In this case, the electronic device 101, after accessing a 5G network access network, may access an external network (e.g., the Internet) under the control of the core network (e.g., the evolved packet core (EPC)) of the legacy network. Protocol information (e.g., LTE protocol information) for communication with the legacy network or protocol information (e.g., New Radio (NR) protocol information) for communication with the 5G network may be stored in the memory 230 and be accessed by other components (e.g., the processor 120, the first CP 212, or the second CP 214).

Figure 3A:
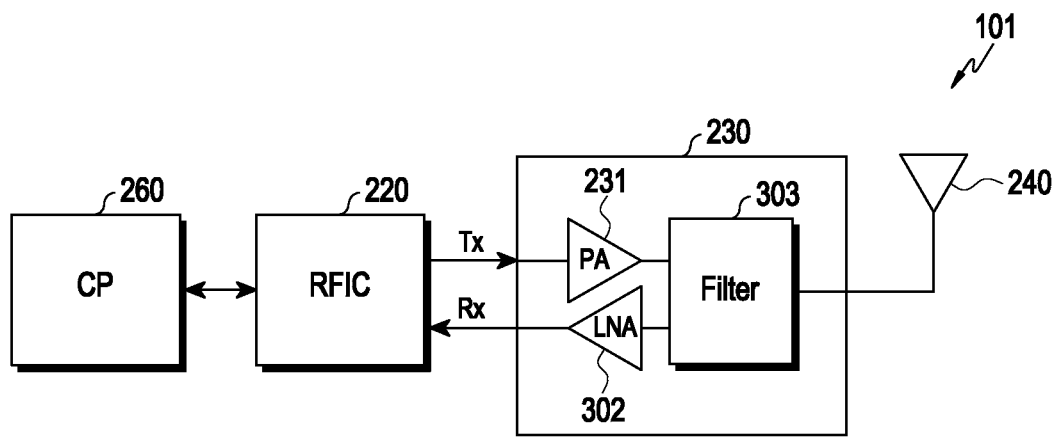
FIG. 3A is a block diagram illustrating an electronic device including a power amplification circuit according to various embodiments.

FIG. 3A is a block diagram illustrating an electronic device including a power amplification circuit according to various embodiments.

Referring to FIG. 3A, according to various embodiments, an electronic device 101 may include a CP 260 (e.g., the first communication processor 212 or the second communication processor 214 of FIG. 2), an RFIC 220, an RFFE 230, or an antenna 240. A baseband signal generated by the CP 260 may be transmitted to the RFIC 220. The RFIC 220 may modulate the baseband signal received from the CP 260 into an RF signal. The RF signal modulated by the RFIC 220 may be input to the RFFE 230.

The RFFE 230 may include a power amplification circuit 231, a low noise amplifier (LNA) 302, or a filter 303. The RFFE 230 may process an RF signal of each radio frequency band. Although FIG. 3A illustrates that the power amplification circuit 231 is included in the RFFE 230, the power amplification circuit 231 may be implemented in various forms. For example, the power amplification circuit 231 may be formed as a separate chip or a separate module from the LNA 302 or filter 303. Although FIG. 3A illustrates that the power amplification circuit 231 is included in the RFFE 230 for convenience of description, various embodiments described below are not limited thereto. The filter 303 may include a duplexer. The RF signal input to the RFFE 230 may be amplified into a signal of a desired magnitude through the power amplification circuit 231 and may then be transmitted through the filter 303 to the antenna 240. The antenna 240 may transmit the signal received from the RFFE 230.

The RF signal received from the antenna 240 may be transmitted to the RFFE 230. The RFFE 230 may transmit the RF signal received from the antenna 240 through the filter 303 and amplify it by the LNA 302. The signal amplified by the LNA 302 may be transmitted to the RFIC 220. The RFIC 220 may receive the signal amplified by the LNA 302 of the RFFE 230 and demodulate it into a baseband signal. The signal demodulated by the RFIC 220 may be transmitted to the CP 260.

Figure 3B:
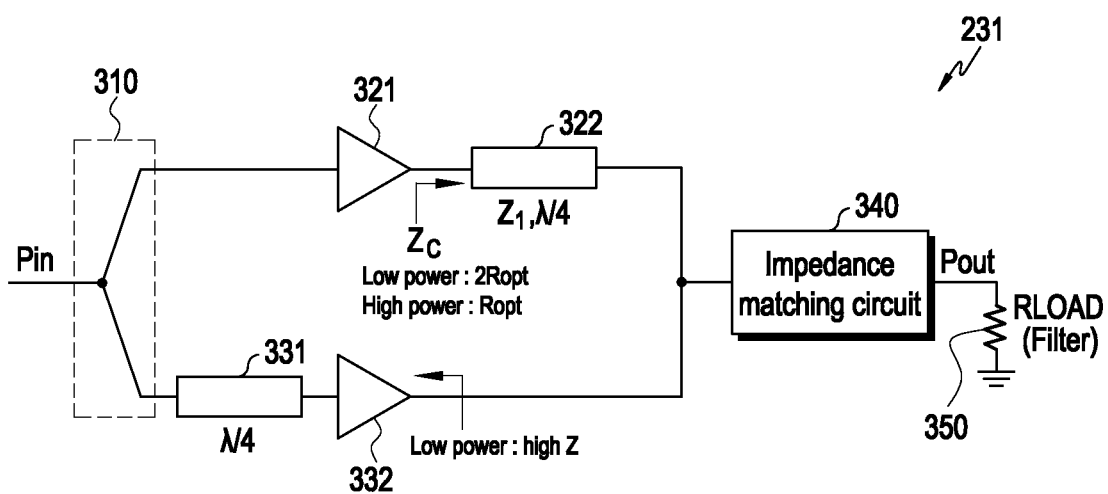
FIG. 3B is a circuit diagram illustrating a power amplification circuit according to various embodiments.

FIG. 3B is a circuit diagram illustrating a power amplification circuit according to various embodiments.

Referring to FIG. 3B, according to various embodiments, the power amplification circuit 231 may include a power distributor 310, a first power amplifier 321, a second power amplifier 332, or an impedance matching circuit 340. The first power amplifier 321 may amplify the input RF signal based on a first bias (or a first bias voltage) and then output the amplified signal. The second power amplifier 332 may amplify the input RF signal based on a second bias (or a second bias voltage) and then output the amplified signal. The power amplification circuit 231 illustrated in FIG. 3B may be referred to as a Doherty amplification circuit, but various embodiments are not limited thereto.

According to various embodiments, the RF signal input to the power amplification circuit 231 may be distributed into two RF signals by the power distributor 310. The power distributor 310 may include at least one of a divider or a splitter, but is not limited thereto. For example, the power distributor 310 may receive an RF signal and output a first RF signal and a second RF signal.

According to various embodiments, the first RF signal output from the power distributor 310 may be input to the first power amplifier 321. The first power amplifier 321 may amplify the first RF signal output from the power distributor 310 based on the first bias, and then transmit it to the impedance matching circuit 340 through a first impedance conversion circuit 322. The first bias of the first power amplifier 321 may be set to class A or class AB. The first impedance conversion circuit 322 may include a $\lambda/4$ transmission line as a passive impedance conversion element for impedance conversion. According to various embodiments, the second RF signal output from the power distributor 310 may be input to the second power amplifier 332 through a second impedance conversion circuit 331. The second impedance conversion circuit 331 may include a $\lambda/4$ transmission line as a passive impedance conversion element for impedance conversion. The second impedance conversion circuit 331 may compensate for a 90-degree phase difference caused between the first power amplifier 331 and the second power amplifier 332 by the first impedance conversion circuit 322 when the second power amplifier 322 operates. The second power amplifier 332 may amplify the second RF signal output from the power distributor 310 and transmitted through the second impedance conversion circuit 331 based on the second bias, and then transmit it to the impedance matching circuit 340. The second bias of the second power amplifier 332 may be set to class C. According to various embodiments, the first RF signal output from the first power amplifier 321 and the second RF signal output from the second power amplifier 332 may be impedance-matched by the impedance matching circuit 340 and then output. A load resistor (RLOAD) 350 may be connected to an output terminal of the impedance matching circuit 340.

According to various embodiments, the first power amplifier 321 may be referred to as a main amplifier or a carrier amplifier, but various embodiments described below are not limited thereto. The second power amplifier 332 may be referred to as an auxiliary amplifier or a peaking amplifier, but various embodiments described below are not limited thereto. According to various embodiments, the first power amplifier 321 may be configured to operate in all power periods, and the second power amplifier 332 may be configured to operate only in a high power period. In various embodiments to be described below, the term "high power period," "mid power period," or "low power period" may be used in a relative sense, and a power boundary value between the periods may be arbitrarily set. For example, the boundary value between the high power period and the mid power period may be set to the maximum power value less about 6 dB (e.g., −6 dB). According to various embodiments, the power of the high power period may be referred to as peak power, and the power of the mid power period and the low power period may be referred to as back-off power. For example, the first power amplifier 321 may set the first bias to A or AB to operate at both the peak power and the back-off power, and the second power amplifier 332 may set the second bias to C to operate only at the peak power. According to various embodiments, the power amplification circuit 231 of FIG. 3B may meet the conditions of Table 1 below to maintain high efficiency in the high power period and the back-off power period.

TABLE 1

| Power period | Status/Impedance | First power amplifier | Second power amplifier |
|---|---|---|---|
| High power period | Power amplifier status (ON/OFF) | ON | ON |
| | Impedance | Ropt | Ropt |
| Mid power period | Power amplifier status (ON/OFF) | ON | OFF |
| | Impedance | 2Ropt | — |
| | Power amplifier bias | Class A (AB) | Class C |

Referring to FIG. 3B, in the high power period, the impedance from the first power amplifier 321 toward the load resistor 350 may be Ropt. Ropt may mean an optimal resistance set in the power amplification circuit 231, but is not limited thereto. In the back-off power period (e.g., the mid power period and the low power period), the second power amplifier 332 may be turned off and, to maintain high efficiency, the impedance from the first power amplifier 321 towards the load resistor 350 may be changed to 2Ropt. The impedance change from Ropt to 2Ropt may be performed gradually or continuously as the power level changes. FIGS.

4A, 4B, and 4C are views illustrating a concept of impedance conversion of a power amplification circuit according to various embodiments.

Figure 4A:
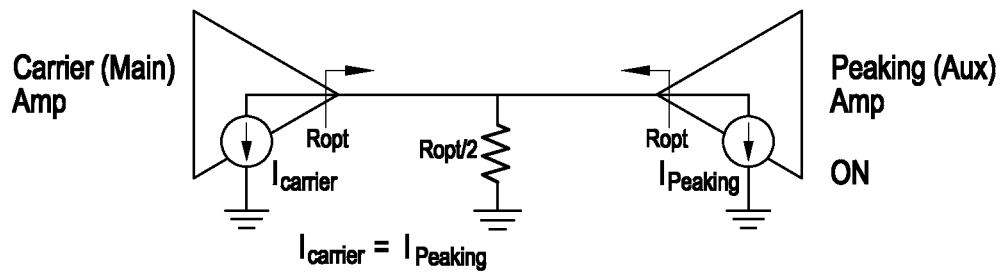
FIG. 4A is a view illustrating a concept of impedance conversion of a power amplification circuit according to various embodiments.
Figure 4B:
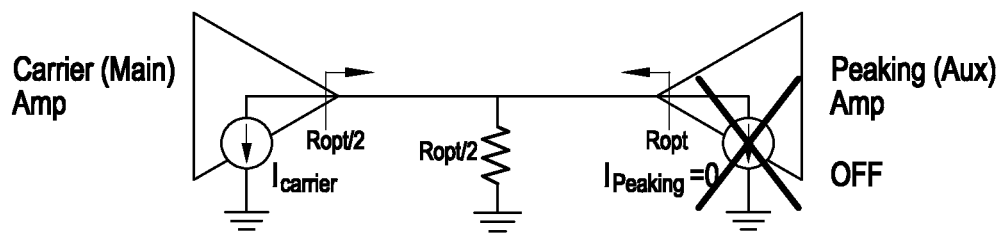
FIG. 4B is a view illustrating a concept of impedance conversion of a power amplification circuit according to various embodiments.
Figure 4C:
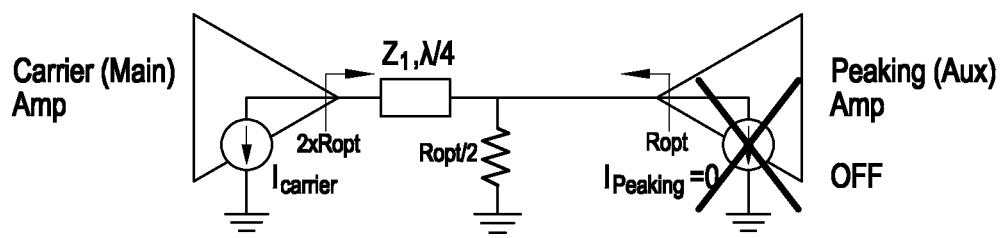
FIG. 4C is a view illustrating a concept of impedance conversion of a power amplification circuit according to various embodiments.

Referring to FIGS. 4A, 4B, and 4C, a first power amplifier 321 (e.g., a main amplifier or a carrier amplifier) and a second power amplifier 332 (e.g., an auxiliary amplifier or a peak amplifier) may be simplified as current sources separated from each other.

Referring to FIG. 4A, the first power amplifier 321 and the second power amplifier 332 are connected in parallel with a load resistor. In the high power period, since the first power amplifier 321 and the second power amplifier 332 both are in the on state, a first output current $I_{carrier}$ of the first power amplifier 321 may have the same magnitude as a second output current $I_{peaking}$ of the second power amplifier 332. Although the first power amplifier 321 generates only the first output current, a double current may flow through the load resistor due to the second output current from the second power amplifier 332. For example, the power generated at the load resistor is $I_{carrier} \times \text{Ropt}(=\text{Ropt}/2 \times 2)$. Although the load resistance is Ropt/2 as illustrated in FIG. 4A, it may be seen as Ropt when viewed from the side of the first power amplifier 321 in the high power period.

According to various embodiments, referring to FIG. 4B, in the mid/low power period (e.g., the back-off power period), the second power amplifier 332 may be continuously switched from the on state to the off state according to the power level and, resultantly, the first power amplifier 321 alone operates, so that the load resistance may be seen as Ropt/2. According to various embodiments, with reference to FIG. 4C, when a first impedance conversion circuit 322 (e.g., a λ/4 transmission line) is added to the output terminal of the first power amplifier 321 as illustrated in FIG. 3B, Impedance conversion occurs at the corresponding frequency, and the impedance viewed from the first power amplifier 321 in the direction of the load resistance may be converted from Ropt/2 to 2× Ropt. As a first impedance conversion circuit 322 is added to the power amplification circuit 231, the condition for maintaining high efficiency shown in Table 1 may be met.

Figure 5:
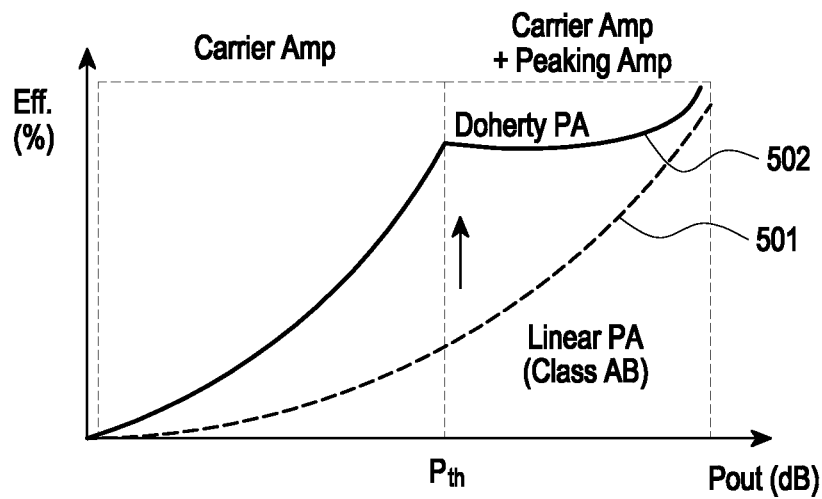
FIG. 5 is a graph illustrating the efficiency of a power amplification circuit in an operation period according to various embodiments.

FIG. 5 is a graph illustrating the efficiency of a power amplification circuit in an operation period according to various embodiments. According to various embodiments, the power amplification circuit 231 described above in connection with FIG. 3B may operate only the first power amplifier 321 in a power period (e.g., a back-off power period) lower than $P_{th}$ and operate both the first power amplifier 321 and the second power amplifier 332 in a power period (e.g., a peak power period) higher than $P_{th}$. For example, referring to FIG. 5, the efficiency 502 of the power amplification circuit 231 may remain higher than the efficiency 501 of a conventional linear amplifier (e.g., a power amplifier set to class AB) in all the power periods. Pw may correspond to −6 dB of the maximum power ($P_{max}$), but is not limited thereto. According to various embodiments, as illustrated in FIG. 5, the power amplification circuit 231 may maintain an efficiency similar to that of the high power period (peak power) even in the mid/low power period (e.g., a back-off power period). As communication standards develop and signal modulation schemes advance, the peak to average power ratio (PAPR) of RF signals may relatively increase, and the power amplifier cannot but process lower root mean square (RMS) power relative to the peak power, lowering the efficiency of the power amplification circuit. Relatively, the power amplification circuit 231 illustrated in FIG. 3B may maintain an efficiency similar to that of the high power period even at mid/low power, thus addressing a reduction in the efficiency of the power amplification circuit due to amplification of a high-PAPR signal (e.g., a 5G communication network signal).

Figure 6:
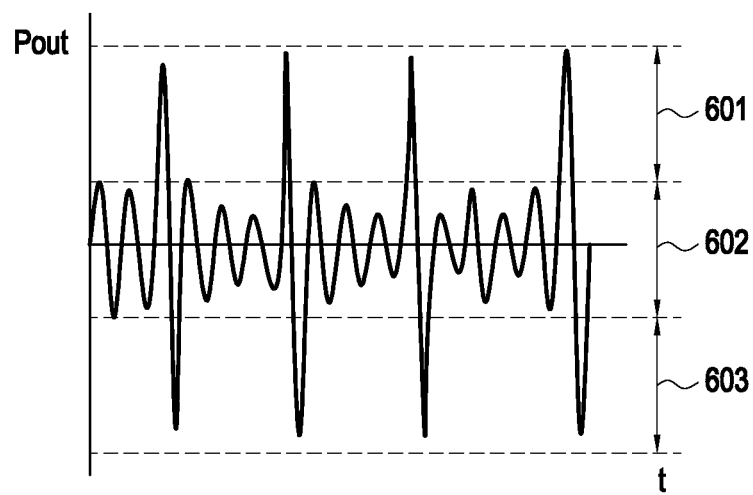
FIG. 6 is a graph illustrating an RF signal input to a power amplification circuit according to various embodiments.

FIG. 6 is a graph illustrating an RF signal input to a power amplification circuit according to various embodiments.

Referring to FIG. 6, an RF signal may have a specific frequency, and the power level of the RF signal may be changed over time. For example, the RF signal may have a high power period 601, a mid power period 602, or a low power period 603. The high power period 601 may be referred to as peak power, and the mid power period 602 and the low power period 603 may be referred to as back-off power. According to various embodiments, the first power amplifier 321 and the second power amplifier 332 may simultaneously operate in the high power period 601 and, in the mid power period 602 and the low power period 603, the first power amplifier 321 alone may operate and the second power amplifier 332 may be turned off.

Figure 7:
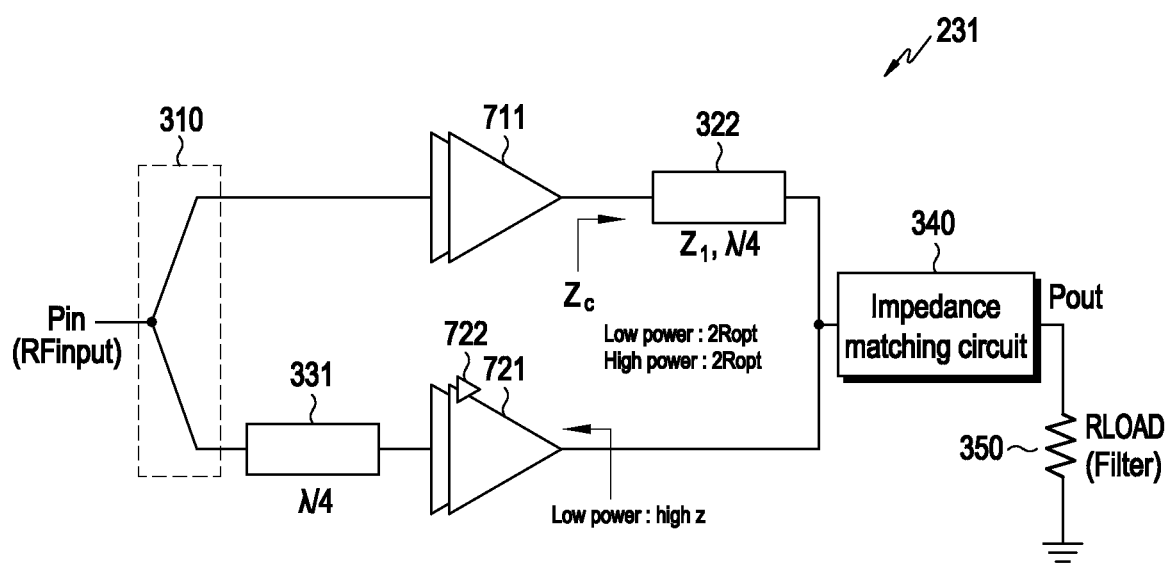
FIG. 7 is a circuit diagram illustrating a power amplification circuit according to various embodiments.

FIG. 7 is a circuit diagram illustrating a power amplification circuit according to various embodiments.

Referring to FIG. 7, according to various embodiments, a power amplification circuit 231 may include a power distributor 310, a first power amplifier 711 (e.g., the first power amplifier 321 of FIG. 3B), a second power amplifier 721 (e.g., the second power amplifier 332 of FIG. 3B), an adaptive bias control circuit 722, or an impedance matching circuit 340. The first power amplifier 711 may amplify the input RF signal based on a first bias (or a first bias voltage) and then output the amplified signal. The second power amplifier 721 may amplify the input RF signal based on a second bias (or a second bias voltage) and then output the amplified signal. The power amplification circuit 231 illustrated in FIG. 7 may be referred to as a Doherty amplification circuit, but various embodiments are not limited thereto.

According to various embodiments, the RF signal input to the power amplification circuit 231 may be distributed into two RF signals by the power distributor 310. The power distributor 310 may include at least one of a divider or a splitter, but is not limited thereto. For example, the power distributor 310 may receive an RF signal and output a first RF signal and a second RF signal.

According to various embodiments, the first RF signal output from the power distributor 310 may be input to the first power amplifier 711. The first power amplifier 711 may amplify the first RF signal output from the power distributor 310 based on the first bias, and then transmit it to the impedance matching circuit 340 through a first impedance conversion circuit 322. The first bias of the first power amplifier 711 may be set to class A or class AB. The first impedance conversion circuit 322 may include a λ/4 transmission line as a passive impedance conversion element for impedance conversion. According to various embodiments, the second RF signal output from the power distributor 310 may be input to the second power amplifier 721 through a second impedance conversion circuit 331. The second impedance conversion circuit 331 may include a λ/4 transmission line as a passive impedance conversion element for impedance conversion. The second impedance conversion circuit 331 may compensate for a 90-degree phase difference caused between the first power amplifier 711 and the second power amplifier 721 by the first impedance conversion circuit 322 when the second power amplifier 721 operates. The second power amplifier 721 may amplify the second RF signal output from the power distributor 310 and transmitted through the second impedance conversion circuit 331 based on the second bias, and then transmit it to the impedance matching circuit 340. According to various embodiments, the second bias of the second power amplifier 721 may be set to class C. According to various embodiments, the second bias of the second amplifier 721 may be adaptively changed. For example, the second bias may be adaptively changed by the adaptive bias control circuit 722. A detailed description of the adaptive bias control circuit 722 is described with reference to FIGS. 9C, 10, and 11.

According to various embodiments, the first RF signal output from the first power amplifier 711 and the second RF signal output from the second power amplifier 721 may be impedance-matched by the impedance matching circuit 340 and then output. A load resistor (RLOAD) 350 may be connected to an output terminal of the impedance matching circuit 340.

According to various embodiments, the first power amplifier 711 may be referred to as a main amplifier or a carrier amplifier, but various embodiments described below are not limited thereto. The second power amplifier 721 may be referred to as an auxiliary amplifier or a peaking amplifier, but various embodiments described below are not limited thereto. According to various embodiments, the first power amplifier 711 may be configured to operate in all power periods, and the second power amplifier 721 may be configured to operate only in a high power period.

In various embodiments, the term "high power period," "mid power period," or "low power period" may be used in a relative sense, and a power boundary value between the periods may be arbitrarily set. For example, the boundary value between the high power period and the mid power period may be set to the maximum power value less about 6 dB (e.g., −6 dB). According to various embodiments, the power of the high power period may be referred to as peak power, and the power of the mid power period and the low power period may be referred to as back-off power. For example, the first power amplifier 711 may set the first bias to A or AB to operate at both the peak power and the back-off power, and the second power amplifier 721 may set the second bias to C to operate only at the peak power.

Figure 11:
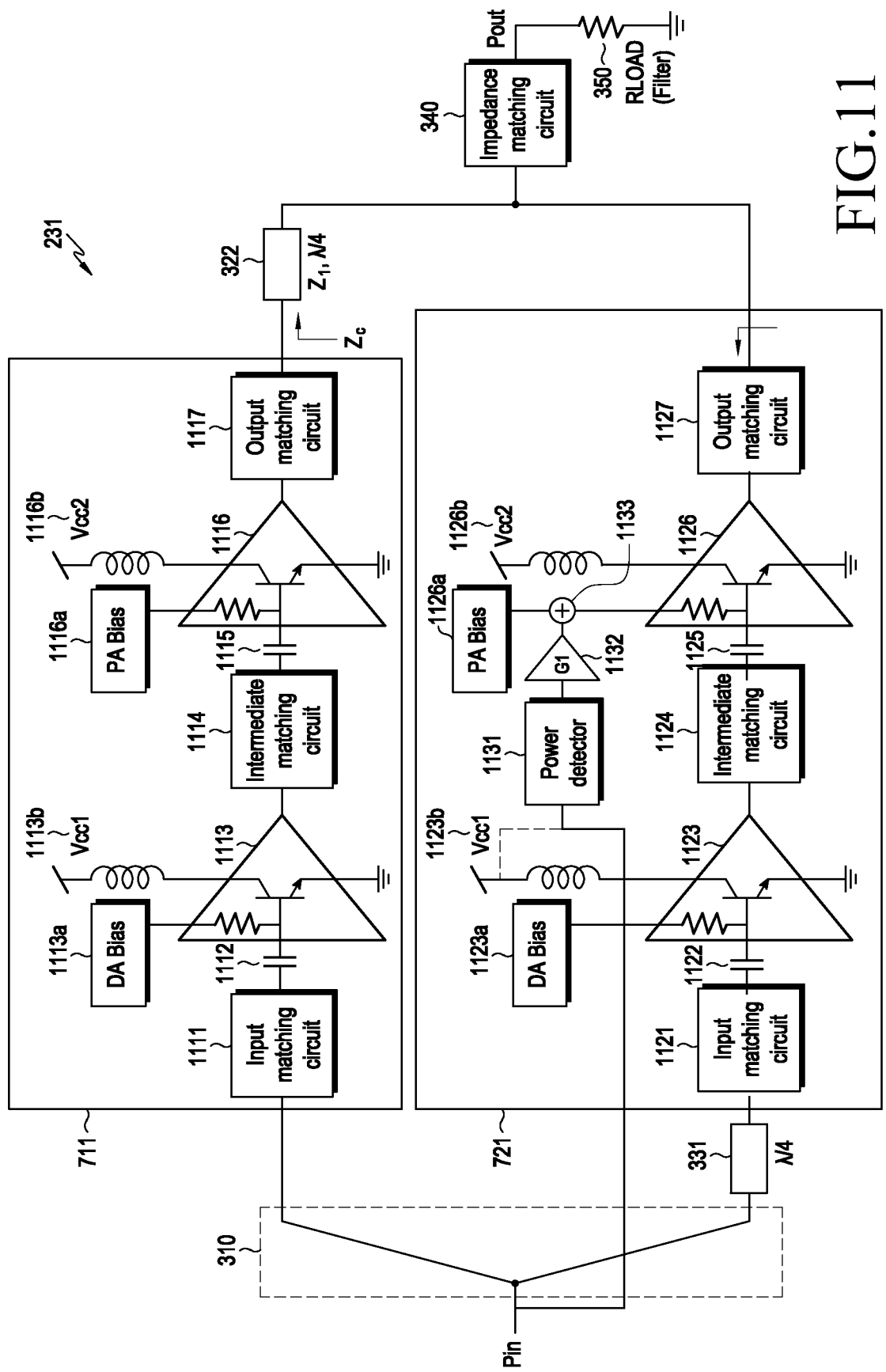
FIG. 11 is a circuit diagram illustrating a power amplification circuit according to various embodiments.

According to various embodiments, the first power amplifier 711 or the second power amplifier 721 each may include a plurality of stages (e.g., two stages or three stages) among a pre-driver stage, a driver stage, or a power stage. For example, the first power amplifier 711 or the second power amplifier 721 each may include a driver amplifier (DA) and/or a power amplifier (PA) as illustrated in FIG. 11.

Figure 8A:
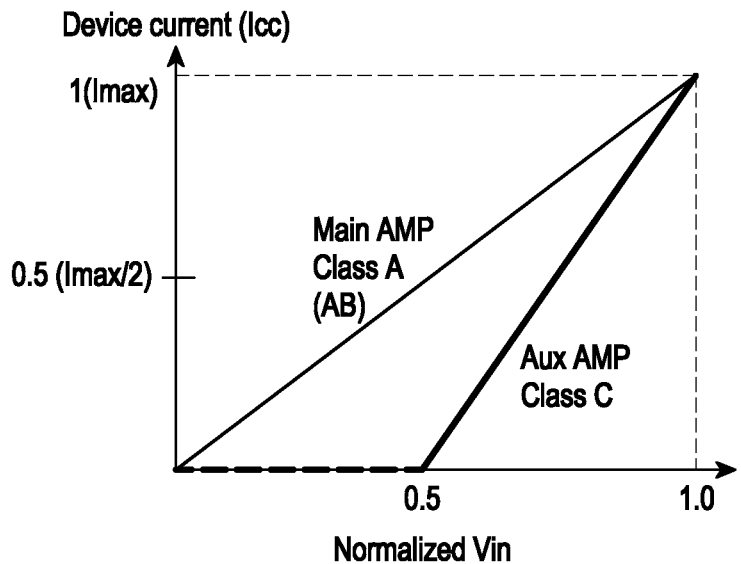
FIG. 8A is a graph illustrating operating currents according to input voltages of power amplifiers according to various embodiments.
Figure 8B:
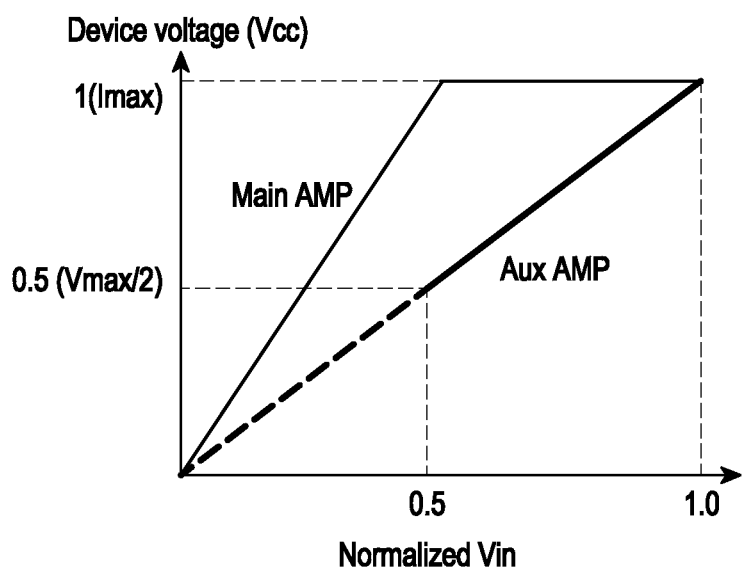
FIG. 8B is a graph illustrating operating voltages according to input voltages of power amplifiers according to various embodiments.
Figure 8C:
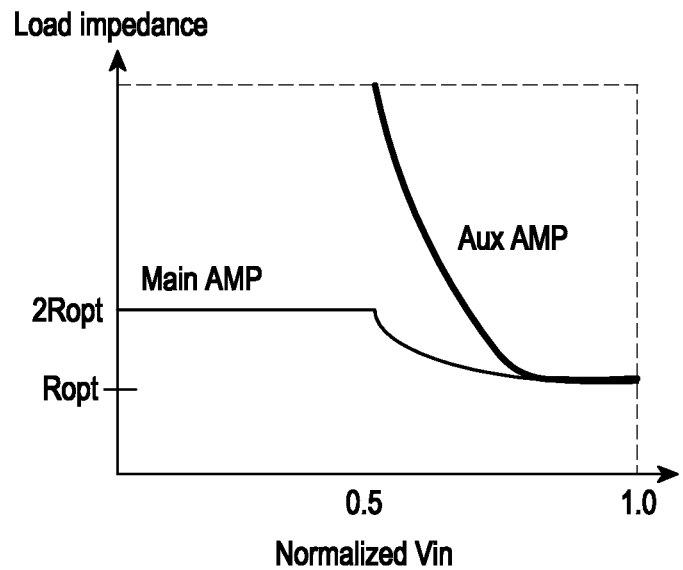
FIG. 8C is a graph illustrating load impedances according to input voltages of power amplifiers according to various embodiments.
Figure 8D:
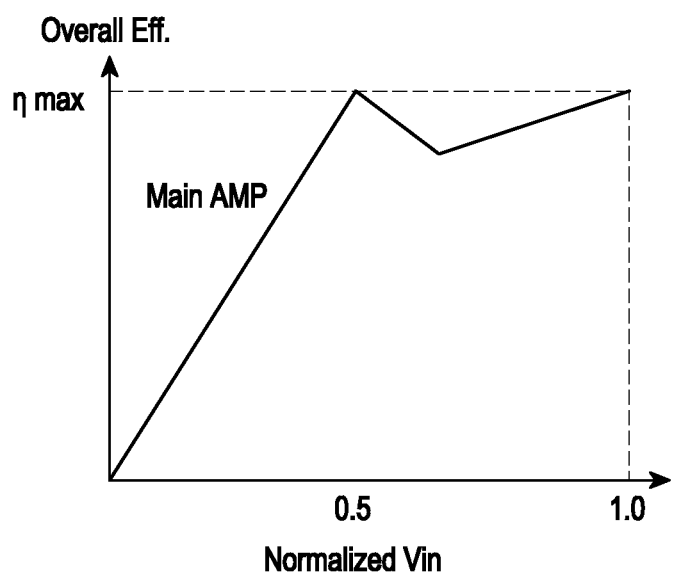
FIG. 8D is a graph illustrating the efficiency of a power amplification circuit according to input voltages of power amplifiers according to various embodiments.

FIG. 8A is a graph illustrating operating currents according to input voltages of power amplifiers according to various embodiments. FIG. 8B is a graph illustrating operating voltages according to input voltages of power amplifiers according to various embodiments. FIG. 8C is a graph illustrating load impedances according to input voltages of power amplifiers according to various embodiments. FIG. 8D is a graph illustrating the efficiency of a power amplification circuit according to input voltages of power amplifiers according to various embodiments.

Referring to FIGS. 8A, 8B, 8C, and 8D, according to various embodiments, in the power amplification circuit 231 of FIG. 7, the first power amplifier 711 and the second power amplifier 721 are connected in parallel, and λ/4 transmission line for converting the load impedance of the first power amplifier 711 in the mid/low power period may be applied. In the power amplification circuit 231, the second bias may be set to be lower than the first bias of the first power amplifier 711 to turn off the second power amplifier 721 in the mid/low power period. As the second bias is set to be lower than the first bias, the conditions for the current/voltage seen from the power amplifiers 711 and 721 may differ according to the power level of the RF signal input to the power amplification circuit 231 as illustrated in FIGS. 8A and 8B. Accordingly, it may be difficult to manage the two power amplifiers 711 and 721 with one protection circuit (e.g., an over current protection (OCP) circuit) like a conventional linear amplifier.

Referring to FIGS. 8A, 8B, 8C, and 8D, the operating conditions (e.g., operating conditions of current, voltage, bias, and impedance) of the first power amplifier 711 and the second power amplifier 721 differ from each other to amplify sufficient power. Thus, if the OCP threshold is adjusted to the condition for a specific power amplifier having higher durability, it may be hard to ensure robustness of the other power amplifier. However, if the OCP threshold is adjusted to the conditions for lower durability, the OCP may be operated before desired power amplification, thus restricting power amplification.

In various embodiments described below, two protection circuits (e.g., OCP circuits) that independently operate to fit a safe operating area (SOA) corresponding to the plurality of power amplifiers may be included.

Figure 9A:
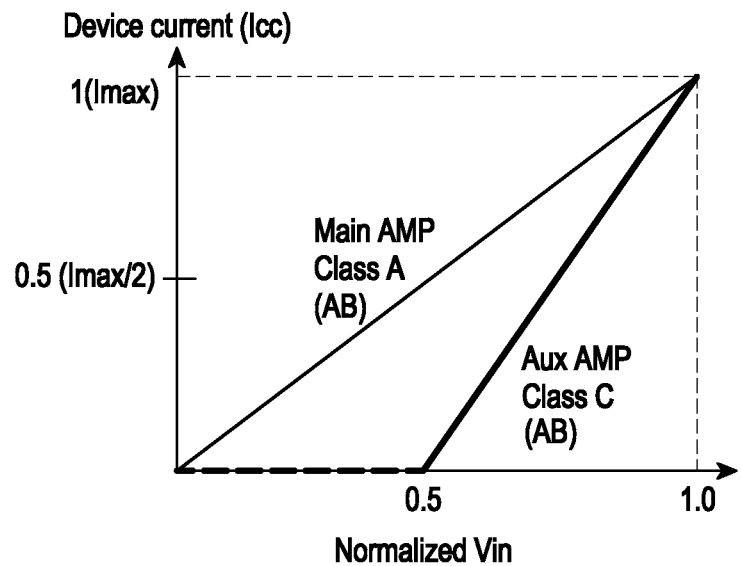
FIG. 9A is a graph illustrating currents according to input voltages of power amplifiers according to various embodiments.

FIG. 9A is a graph illustrating currents according to input voltages of power amplifiers according to various embodiments.

Referring to FIG. 9A, ideal operating currents of the first power amplifier 711 and the second power amplifier 721 may be the same as those of FIG. 8A. According to various embodiments, as described above, the first power amplifier 711 has a relatively high bias set as compared to the second power amplifier 721 and thus may always operate in an on state regardless of the power level. As illustrated in FIG. 9A, as input/output power increases, the output current of the first power amplifier 711 may linearly increase. The second power amplifier 721 maintains an OFF state in the low/mid power period and, upon entering the high power period, gradually turns on, so that the same level of current as the first power amplifier 711 may flow in the peak power period.

Figure 9B:
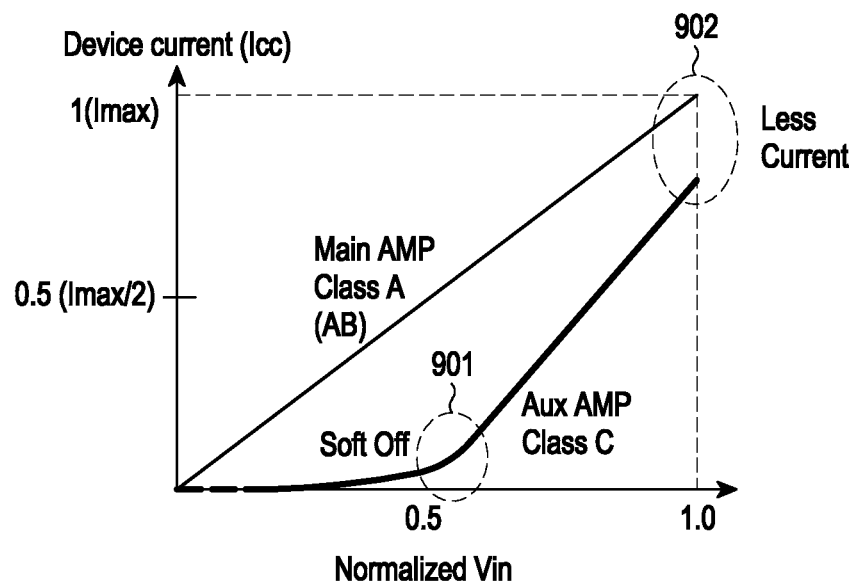
FIG. 9B is a graph illustrating currents according to input voltages of power amplifiers according to various embodiments.

According to various embodiments, referring to FIG. 9B, since a relatively low bias is applied to the second power amplifier 721 as compared to the first power amplifier 711, less current may flow through the second power amplifier 721, as compared with the first power amplifier 711, in the peak power period. Further, if the bias of the second power amplifier 721 is set to a level similar to that of the first power amplifier 711, the second power amplifier 721 may not be completely turned off in the low/mid power period.

Figure 9C:
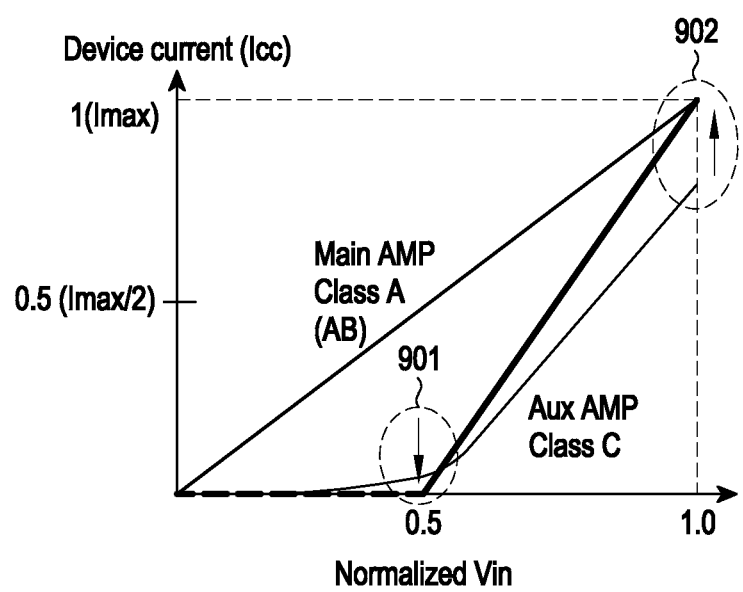
FIG. 9C is a graph illustrating currents according to input voltages of power amplifiers according to various embodiments.
Figure 10:
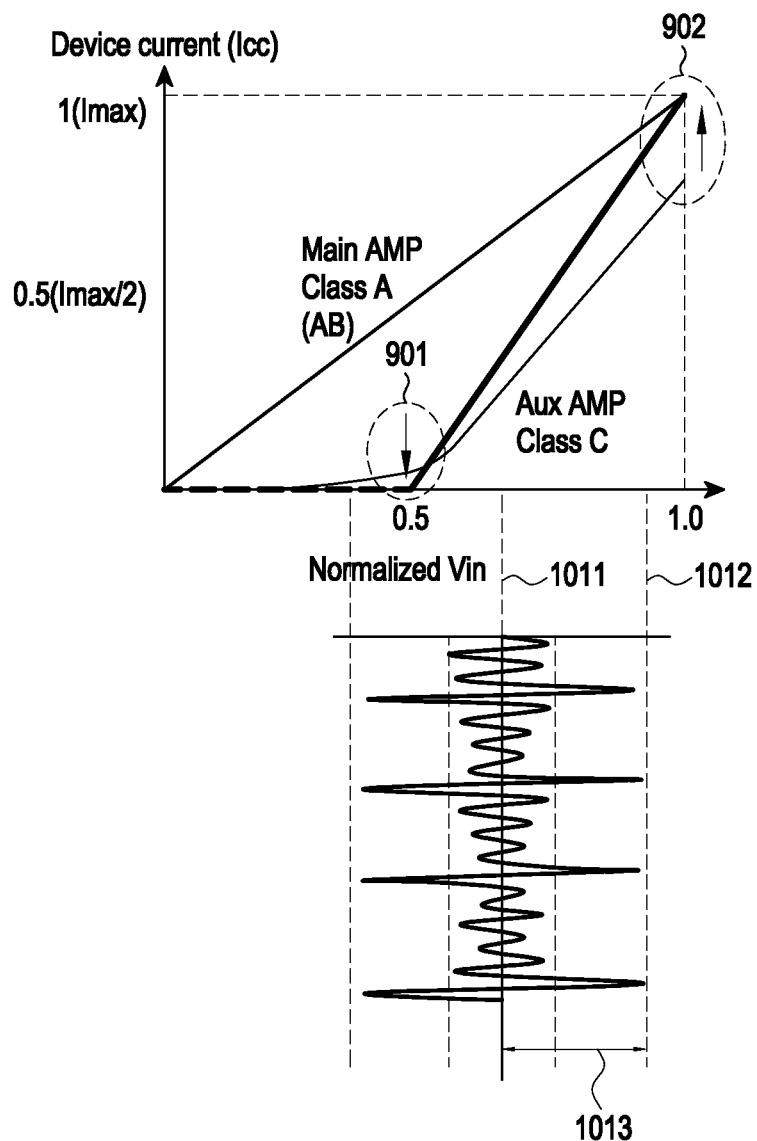
FIG. 10 is a graph illustrating currents according to input voltages of a power amplifier using an adaptive bias according to various embodiments.

FIG. 9C is a graph illustrating currents according to input voltages of power amplifiers according to various embodiments. FIG. 10 is a graph illustrating currents according to input voltages of a power amplifier using an adaptive bias according to various embodiments.

According to various embodiments, referring to FIGS. 9C and 10, an adaptive bias control circuit may be added to the second power amplifier 721 to address the issues set forth in connection with FIG. 9B. As illustrated in FIGS. 9C and 10, it is possible to amplify sufficient current and power in the high power period by providing a relatively lower bias in the low power period 1011, as indicated with 901, to thereby turn off the second power amplifier 721 while providing a relatively higher bias in the high power period 1012, as indicated with 902, by the adaptive bias control circuit. According to various embodiments, the adaptive bias control circuit may adjust the bias while following, in real time, along the envelope of the RF signal, rendering it possible to effectively approach an ideal efficiency even for RF signals having a high PAPR 1013.

FIG. 11 is a circuit diagram illustrating a power amplification circuit according to various embodiments.

Referring to FIG. 11, according to various embodiments, each power amplifier of the power amplification circuit 231 may include a two-stage power amplifier. For example, the first power amplifier 711 or the second power amplifier 721 each may include a driver amplifier (DA) and a power amplifier (PA).

According to various embodiments, the first power amplifier 711 may include a 1-1st power amplifier 1113 (e.g., a first DA) and a 1-2nd power amplifier 1116 (e.g., a first PA). A first input matching circuit 1111 and/or a 1-1st capacitor 1112 may be connected to the front end of the 1-1st power amplifier 1113. A first intermediate matching circuit 1114 or a 1-2nd capacitor 1115 may be connected between the 1-1st power amplifier 1113 and the 1-2nd power amplifier 1116. A first output matching circuit 1117 may be connected to the rear end of the 1-2nd power amplifier 1116. The 1-1st power amplifier 1113 may receive $V_{cc1}$ 1113b through an RF choke, and a 1-1st bias 1113a (first DA bias) may be connected thereto. The 1-2nd power amplifier 1116 may receive $V_{cc2}$ 1116b through an RF choke, and a 1-2nd bias 1116a (first PA bias) may be connected thereto.

According to various embodiments, the second power amplifier 721 may include a 2-1st power amplifier 1123 (e.g., a second DA) and a 2-2nd power amplifier 1126 (e.g., a second PA). A second input matching circuit 1121 and/or a 2-1st capacitor 1122 may be connected to the front end of the 2-1st power amplifier 1123. A second intermediate matching circuit 1124 or a 2-2nd capacitor 1125 may be connected between the 2-1st power amplifier 1123 and the 2-2nd power amplifier 1126. A second output matching circuit 1127 may be connected to the rear end of the 2-2nd power amplifier 1126. The 2-1st power amplifier 1123 may receive $V_{cc1}$ 1123b through an RF choke, and a 2-1st bias 1123a (second DA bias) may be connected thereto. The 2-2nd power amplifier 1126 may receive $V_{cc2}$ 1126b through an RF choke, and a 2-2nd bias 1126a (second PA bias) may be connected thereto.

According to various embodiments, as described above with reference to FIGS. 7 and 10, the adaptive bias control circuit 722 may be connected to the 2-2nd bias 1126a of the 2-2nd power amplifier 1126. For example, the adaptive bias control circuit 722 may include a power detector 1131, an amplifier 1132, or an adder 1133. According to various embodiments, the power detector 1131 may detect an RF signal (Pin) or $V_{cc1}$ 1123b input to the power amplification circuit 231 and output the magnitude of the envelope voltage in real time. According to various embodiments, the power detector 1131 may be implemented as the circuit of FIG. 12B. For example, the power detector 1100 may include an envelope detector. The power detector 1100 is described below with reference to FIGS. 12A, 12B, and 12C.

Figure 12A:
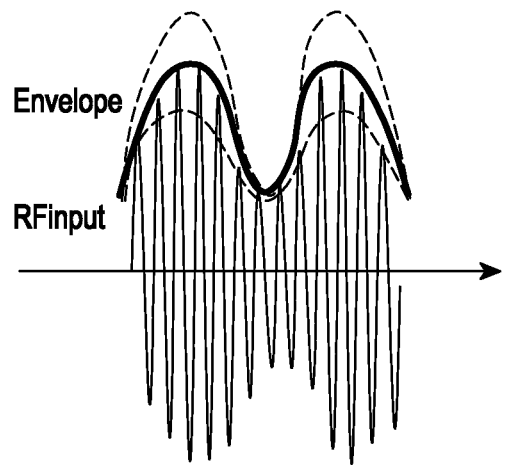
FIG. 12A is a graph illustrating an RF signal input to a power amplification circuit according to various embodiments.
Figure 12B:
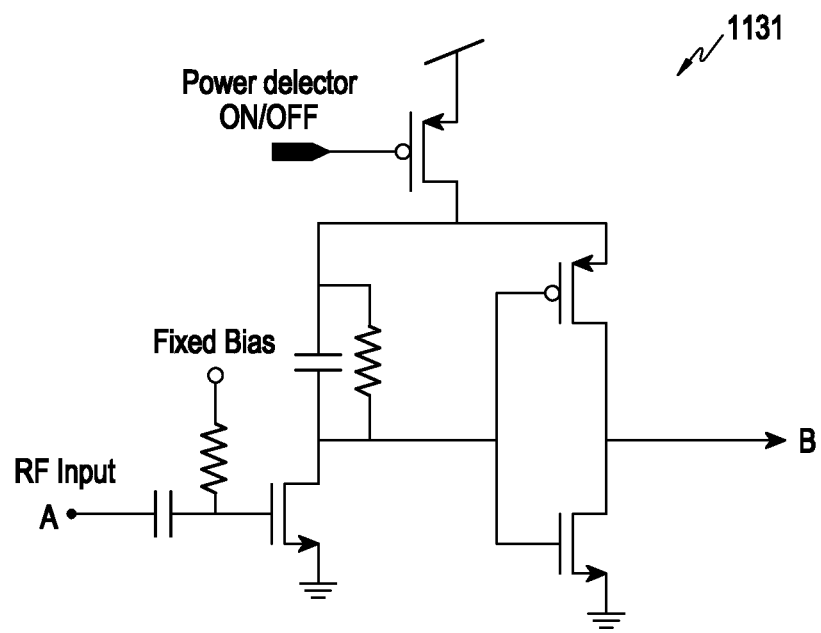
FIG. 12B is a circuit diagram illustrating a power detector of an adaptive bias control circuit according to various embodiments.
Figure 12C:
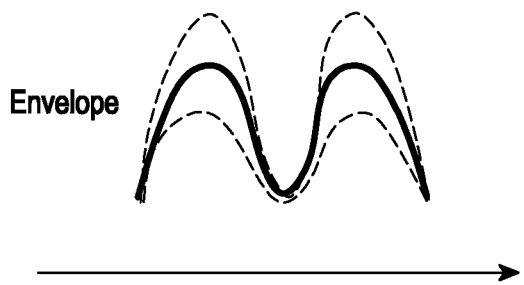
FIG. 12C is a graph illustrating a signal output from a power detector according to various embodiments.

FIG. 12A is a graph illustrating an RF signal input to a power amplification circuit according to various embodiments. FIG. 12B is a circuit diagram illustrating a power detector of an adaptive bias control circuit according to various embodiments. FIG. 12C is a graph illustrating a signal output from a power detector according to various embodiments.

The power detector 1131 may receive an RF signal having the waveform illustrated in FIG. 12A, as the RF signal (Pin) or $V_{cc1}$ 1223b input to the power amplification circuit 231. The power detector 1131 may output an envelope in the waveform illustrated in FIG. 12A through the circuit of FIG. 12B.

Referring to FIG. 12B, the power detector 1131 may receive an ON/OFF control signal from a controller to be turned ON/OFF. According to various embodiments, the RF signal input to terminal A of the power detector 1131 may be amplified in the first stage based on a fixed bias, and a bandwidth of the envelope may be set with R and C of the drain terminal. Since the input signal is inverted by 180 degrees and amplified in the first stage, the input and output of the adaptive bias may be rendered to be in-phase by inverting the signal again by 180 degrees in the second stage. The waveform of FIG. 12C may be output from terminal B of the power detector 1131. The output signal of the power detector 1131 may be amplified through the amplifier 1132, and then added to the 2-2nd bias 1126a by the adder 1133 and then supplied to the 2-2nd power amplifier 1126. According to various embodiments, if the adaptive bias control circuit 722 malfunctions to instantaneously provide a bias higher than an appropriate level, the 2-2nd power amplifier 1126 may be highly likely to be damaged.

In various embodiments described below, a protection circuit (e.g., an OCP circuit) is added to each of the first power amplifier 711 and the second power amplifier 721 to ensure the performance of each power amplifier 711 and 721 while protecting them from damage. According to various embodiments, a monitoring circuit may be added to each of the first power amplifier 711 and the second power amplifier 721 to make it possible to identify which power amplifier is damaged from outside the power amplification circuit 231. According to various embodiments, when OCP occurs in the second power amplifier 721, a recurrence of OCP may be prevented by controlling the adaptive bias control circuit 722 of the second power amplifier 721 to adjust the gain of the amplifier 1132.

Figure 13A:
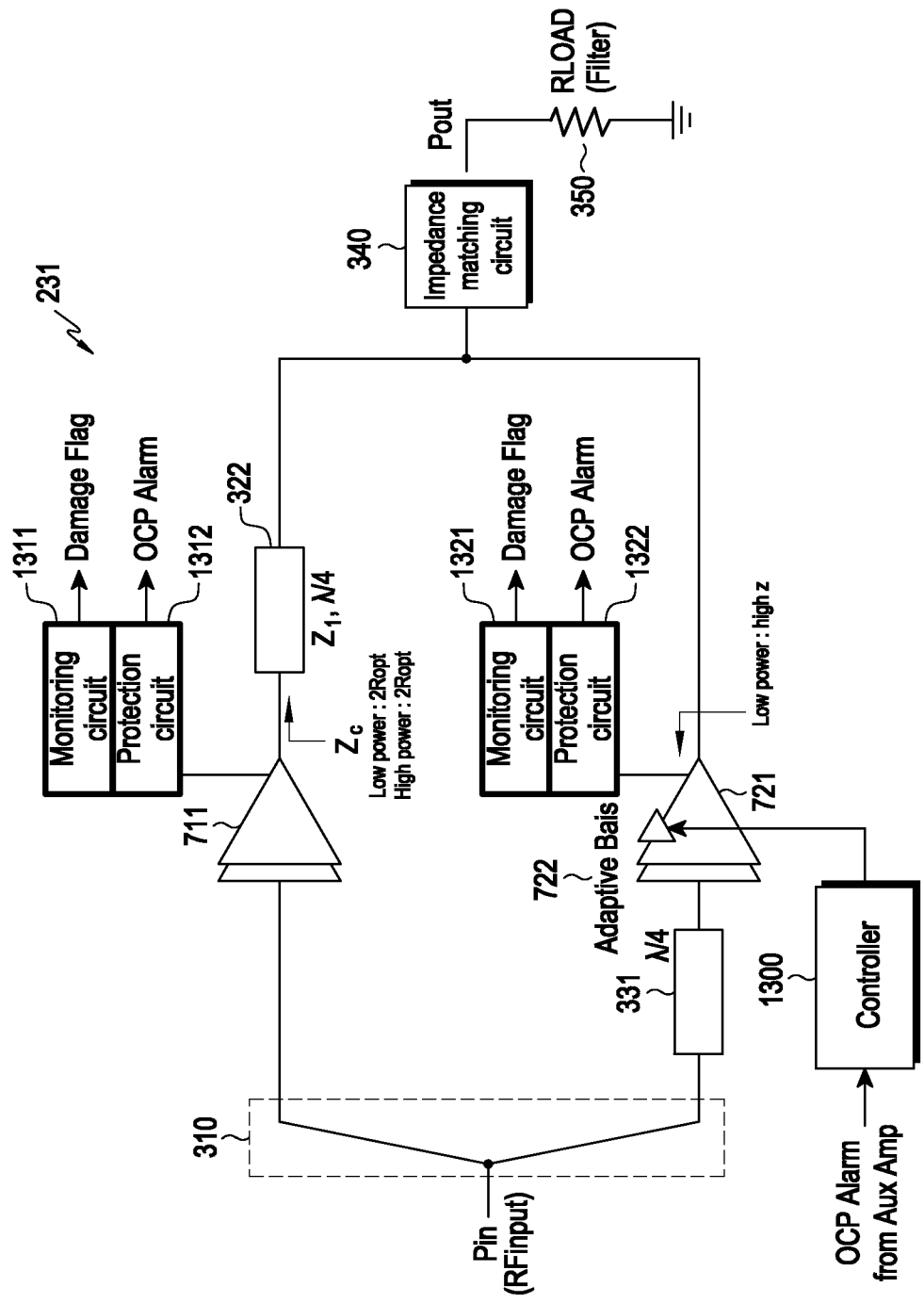
FIG. 13A is a circuit diagram illustrating a power amplification circuit according to various embodiments.

FIG. 13A is a circuit diagram illustrating a power amplification circuit according to various embodiments.

Referring to FIG. 13A, according to various embodiments, the power amplification circuit 231 may include a power distributor 310, a first power amplifier 711, a second power amplifier 721, or an impedance matching circuit 340. The first power amplifier 711 may amplify the input RF signal based on a first bias (or a first bias voltage) and then output the amplified signal. The second power amplifier 721 may amplify the input RF signal based on a second bias (or a second bias voltage) and then output the amplified signal. The power amplification circuit 231 illustrated in FIG. 13A may be referred to as a Doherty amplification circuit, but various embodiments are not limited thereto.

According to various embodiments, the RF signal input to the power amplification circuit 231 may be distributed into two RF signals by the power distributor 310. The power distributor 310 may include at least one of a divider or a splitter, but is not limited thereto. For example, the power distributor 310 may receive an RF signal and output a first RF signal and a second RF signal.

According to various embodiments, the first RF signal output from the power distributor 310 may be input to the first power amplifier 711. The first power amplifier 711 may amplify the first RF signal output from the power distributor 310 based on the first bias, and then transmit it to the impedance matching circuit 340 through a first impedance conversion circuit 322. The first bias of the first power amplifier 711 may be set to class A or class AB. The first impedance conversion circuit 322 may include λ/4 transmission line as a passive impedance conversion element for impedance conversion. According to various embodiments, the second RF signal output from the power distributor 310 may be input to the second power amplifier 721 through a second impedance conversion circuit 331. The second impedance conversion circuit 331 may include a λ/4 transmission line as a passive impedance conversion element for impedance conversion. The second impedance conversion circuit 331 may compensate for a 90-degree phase difference caused between the first power amplifier 711 and the second power amplifier 721 by the first impedance conversion circuit 322 when the second power amplifier 721 operates. The second power amplifier 721 may amplify the second RF signal output from the power distributor 310 and transmitted through the second impedance conversion circuit 331 based on the second bias, and then transmit it to the impedance matching circuit 340.

According to various embodiments, the first power amplifier 711 may be referred to as a main amplifier or a carrier amplifier, but various embodiments described below are not limited thereto. The second power amplifier 721 may be referred to as an auxiliary amplifier or a peaking amplifier, but various embodiments described below are not limited thereto. According to various embodiments, the first power amplifier 711 may be configured to operate in all power periods, and the second power amplifier 721 may be configured to operate only in a high power period. In various embodiments described below, the term "high power period," "mid power period," or "low power period" may be used in a relative sense, and a power boundary value between the periods may be arbitrarily set. For example, the boundary value between the high power period and the mid power period may be set to the maximum power value less about 6 dB (e.g., −6 dB).

According to various embodiments, the power of the high power period may be referred to as peak power, and the power of the mid power period and the low power period may be referred to as back-off power. For example, the first power amplifier 711 may set the first bias to A or AB to operate at both the peak power and the back-off power, and the second power amplifier 721 may set the second bias to C to operate only at the peak power.

According to various embodiments, the second bias of the second power amplifier 721 may be adaptively controlled by the adaptive bias control circuit 722 as described above with reference to FIGS. 9C and 10. For example, as illustrated in FIGS. 9C and 10, it is possible to amplify sufficient current and power in the high power period by providing a relatively lower bias in the low power period to thereby turn off the second power amplifier 721 while providing a relatively higher bias in the high power period by the adaptive bias control circuit 722. According to various embodiments, the adaptive bias control circuit 722 may adjust the bias while following, in real time, along the envelope of the RF signal input to the power amplification circuit 231, rendering it possible to effectively approach an ideal efficiency even for RF signals having a high PAPR 1013.

According to various embodiments, the power amplification circuit 231 may include a first monitoring circuit 1311 and/or a first protection circuit 1312 (e.g., a first OCP circuit) connected with the first power amplifier 711. The first monitoring circuit 1311 may determine whether the first power amplifier 711 is normally operated or damaged, and may output a damage flag indicating whether the first power amplifier 711 is damaged. The damage flag output from the first monitoring circuit 1311 may be input to the controller 1300. An embodiment of the first monitoring circuit 1311 is described below in detail with reference to FIGS. 14, 15, and 16. The first protection circuit 1312 may output an OCP alarm when an overcurrent occurs in the first power amplifier 711. The OCP alarm output from the first protection circuit 1312 may be input to the controller 1300. An embodiment of the first protection circuit 1312 is described below in detail with reference to FIGS. 14 and 17.

According to various embodiments, the power amplification circuit 231 may include a second monitoring circuit 1321 and/or a second protection circuit 1322 (e.g., a second OCP circuit) connected with the second power amplifier 721. can The second monitoring circuit 1321 may determine whether the second power amplifier 721 is normally operated or damaged, and may output a damage flag indicating whether the second power amplifier 721 is damaged. The damage flag output from the second monitoring circuit 1321 may be input to the controller 1300. An embodiment of the second monitoring circuit 1321 is described below in detail with reference to FIGS. 14, 15, and 16.

The second protection circuit 1322 may output an OCP alarm when an overcurrent occurs in the second power amplifier 721. The OCP alarm output from the second protection circuit 1322 may be input to the controller 1300. An embodiment of the second protection circuit 1322 is described below in detail with reference to FIGS. 14 and 17.

According to various embodiments, the controller 1300 may receive an OCP alarm from the second protection circuit 1322 and control the adaptive bias control circuit 722 based on the received OCP alarm. An embodiment of controlling the adaptive bias control circuit 722 by the controller 1300 is described below with reference to FIGS. 19 and 20.

Figure 13B:
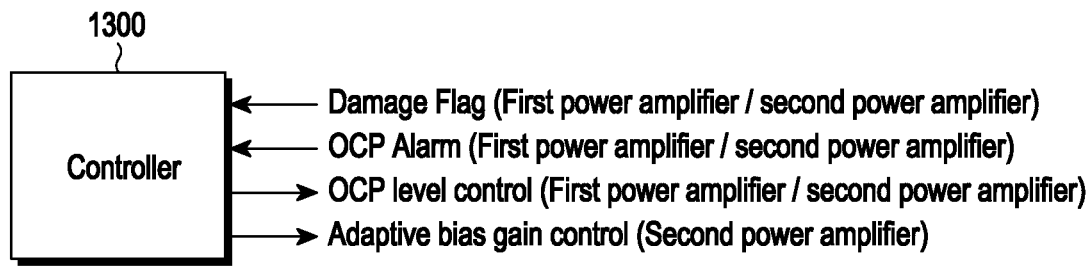
FIG. 13B is a view illustrating input/output information for a controller according to various embodiments.

FIG. 13B is a view illustrating input/output information for a controller according to various embodiments.

Referring to FIG. 13B, according to various embodiments, the controller 1300 may receive a damage flag from the first monitoring circuit 1311 or the second monitoring circuit 1321. The controller 1300 may identify whether the first power amplifier 711 or the second power amplifier 721 is damaged or broken by identifying the received damage flag. According to various embodiments, the controller 1300 may identify which power amplifier the damage flag has been transmitted from, through the line or terminal through which the damage flag has been transmitted. According to various embodiments, the controller 1300 may identify which power amplifier the damage flag has been transmitted from, through identification information for the power amplifier included in the signal transmitted together with the damage flag.

According to various embodiments, the controller 1300 may receive an OCP alarm from the first protection circuit 1312 or the second protection circuit 1322. The controller 1300 may identify whether an overcurrent occurs in the first power amplifier 711 or the second power amplifier 721 by identifying the received OCP alarm. According to various embodiments, the controller 1300 may identify which power amplifier the OCP alarm has been transmitted from, through the line or terminal through which the OCP alarm has been transmitted. According to various embodiments, the controller 1300 may identify which power amplifier the OCP alarm has been transmitted from, through identification information for the power amplifier included in the signal transmitted together with the OCP alarm. According to various embodiments, the controller 1300 may control the OCP level of the corresponding power amplifier 711 or 721 or control the gain of the adaptive bias control circuit 722 based on the received OCP alarm.

Figure 14:
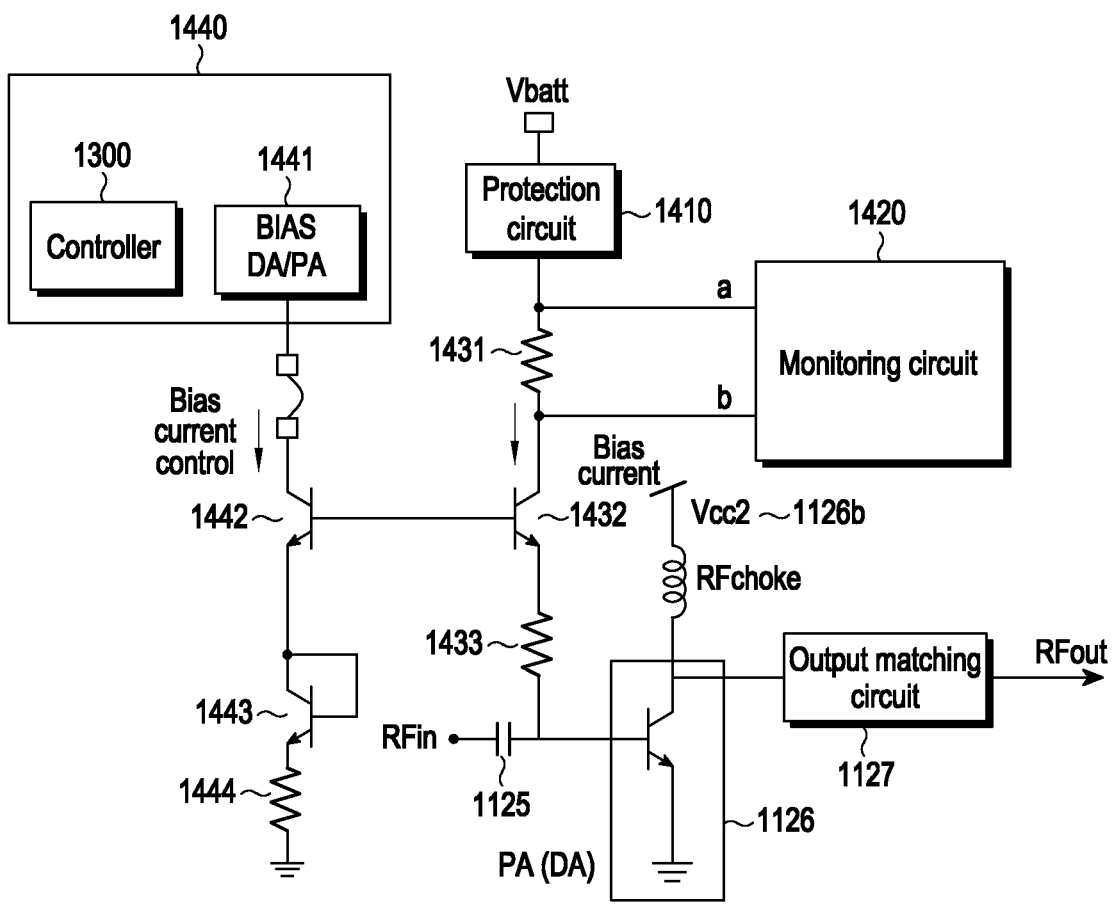
FIG. 14 is a circuit diagram illustrating a power amplifier according to various embodiments.

FIG. 14 is a circuit diagram illustrating a power amplifier according to various embodiments.

Referring to FIG. 14, according to various embodiments, a protection circuit and/or a monitoring circuit may be added to the bias terminal of each of the power amplifiers 711 and 721. FIG. 14 illustrates an example in which a protection circuit 1410 and a monitoring circuit 1420 are added to the 2-2nd power amplifier 1126 for convenience of description, which may also be applied to other power amplifiers (e.g., the 1-1st power amplifier 1113, the 1-2nd power amplifier 1116, and the 2-1st power amplifier 1123) in substantially the same or a similar manner.

According to various embodiments, a voltage Vbatt may be supplied to the bias terminal of the 2-2nd power amplifier 1126. For example, the Vbatt voltage may be applied to the bias terminal of the 2-2nd power amplifier 1126 through the protection circuit 1410 (e.g., an OCP circuit), the first resistor 1431, the first switching element 1432, or the second resistor 1433. A monitoring circuit 1420 may be connected in parallel to both terminals (e.g., terminal a and terminal b) of the first resistor 1431.

According to various embodiments, an integrated circuit 1440 may include a controller 1300 or a bias control circuit 1441. The integrated circuit 1440 may correspond to, or be included in, any one of the AP 120, the CP 260, the RFIC 220, or the RFFE 230. The integrated circuit 1440 may be included in the power amplification circuit 231. According to various embodiments, the gate terminal of the first switching element 1432 may be connected to the gate terminal of the second switching element 1442. The second switching element 1442 may receive a bias current control signal output from the bias control circuit 1441 included in the integrated circuit 1440 and may supply it to the third switching element 1443 connected with the third resistor 1444 under the control of the gate terminal. According to various embodiments, the bias current flowing to the bias terminal of the 2-2nd power amplifier 1126 through the first switching element 1432 may be controlled by the bias current control signal flowing through the second switching element 1442.

Figure 15:
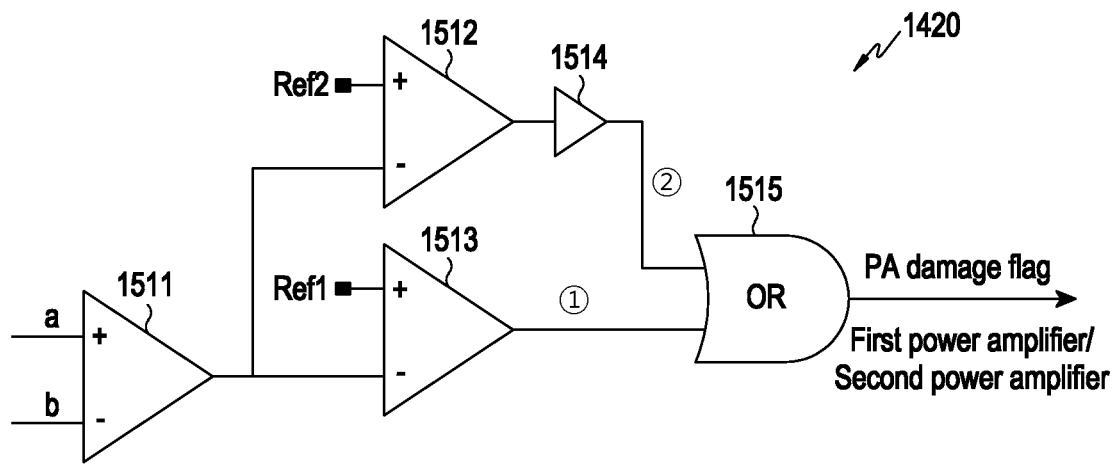
FIG. 15 is a circuit diagram illustrating a monitoring circuit according to various embodiments.

FIG. 15 is a circuit diagram illustrating a monitoring circuit according to various embodiments.

Referring to FIG. 15, according to various embodiments, the monitoring circuit 1420 may identify whether the power amplifier (e.g., the 2-2nd power amplifier 1126) is damaged by detecting the voltage between both the terminals of the first resistor 1431 through which the bias current Ibatt input to the bias terminal in FIG. 14 flows. According to various embodiments, the first resistor 1431 may be a resistor for measuring voltage and may be set to have a relatively lower resistance than that of the second resistor 1433 or the third resistor 1444. According to various embodiments, the monitoring circuit 1420 may include a first comparator 1511, a second comparator 1512, a third comparator 1513, a NOT gate 1415, or an OR gate 1515. The first comparator 1511 may output the voltage difference ΔV between both the terminals of the first resistor 1431, compare the output voltage difference with a second reference value Ref2 through the second comparator 1512, and compare the voltage difference with a first reference value Ref1 through the third comparator 1513. The output value of the second comparator 1512 may undergo a NOT operation through the NOT gate 1514 and may then be input to the OR gate 1515.

Figure 16:
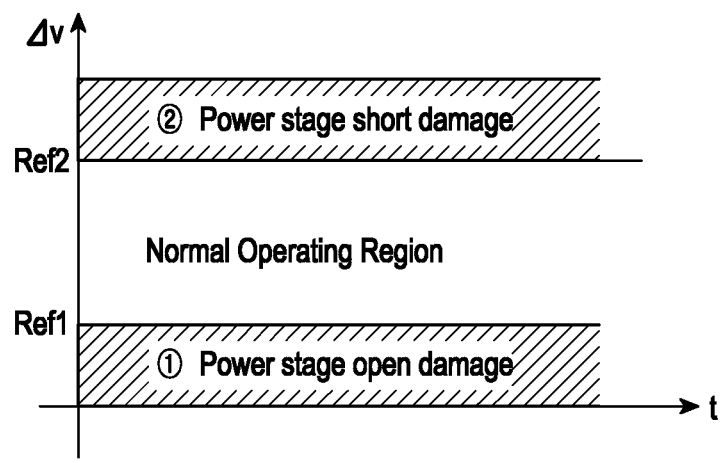
FIG. 16 is a graph illustrating a damage period determined by a monitoring circuit according to various embodiments.

FIG. 16 is a graph illustrating a damage period determined by a monitoring circuit according to various embodiments.

Referring to FIGS. 15 and 16, when the output value of the NOT gate 1514 is 1, the voltage difference is greater than the second reference value Ref2, and this may correspond to region ② of FIG. 16. The output value of the third comparator 1513, as it is, may be input to the OR gate 1515. When the output value of the third comparator 1513 is 'high' or '1,' the voltage difference is smaller than the first reference value Ref1, and this may correspond to region ① of FIG. 16. When the voltage difference corresponds to region ① or region ② of FIG. 16 (e.g., when the output value of the NOT gate 1514 is 'high' or '1,' or when the output value of the third comparator 1513 is 'high' or '1'), it is determined that the power amplifier is damaged, and a damage flag may be output as '1.' The damage flag output from the monitoring circuit 1420 may be transmitted to the controller 1300. According to various embodiments, when the damage flag is transmitted to the controller 1300, identification information for the power amplifier (e.g., the 2-2nd power amplifier 1126) corresponding to the monitoring circuit 1420 to which the damage flag is transmitted may be transmitted together. The controller 1300 may identify the damage flag transmitted from the monitoring circuit 1420 and determine whether the power amplifier from which the damage flag has been transmitted is damaged. According to various embodiments, when the output value of the third comparator 1513 is 'low' or '0' and the output value of the NOT gate 1514 is 'low' or '0,' this corresponds to a region between regions ① and ② of FIG. 16, which is a normal operating area, so that a damage flag may be output as '0'. According to various embodiments, damage flag information for each of the power amplifiers 1113, 1116, 1123, and 1126 may be transmitted to the controller 1300 and stored in a register. It is possible to identify whether a specific power amplifier is damaged or broken by identifying the damage flag information stored in the register. For example, it is possible to identify whether each power amplifier is damaged or broken by requesting damage flag information from the outside of the controller 1300 through a mobile industry processor interface (MIPI) line to the controller 1300. According to various embodiments, when a specific power amplifier is damaged or broken, the OCP reference of the power amplifier may be adjusted. According to various embodiments, when a specific power amplifier is damaged or broken, the gain of the adaptive bias control circuit of the power amplifier (e.g., the gain of the amplifier 1132) may be lowered, thereby reducing a likelihood of further damage.

Figure 17:
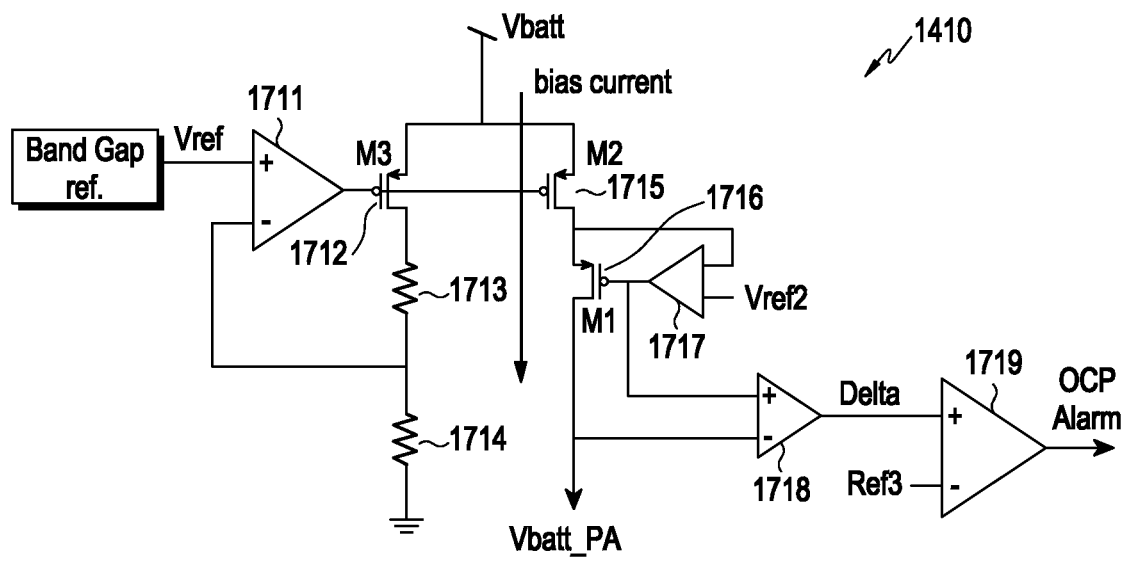
FIG. 17 is a circuit diagram illustrating an OCP circuit according to various embodiments.

FIG. 17 is a circuit diagram illustrating an OCP circuit according to various embodiments.

Referring to FIG. 17, according to various embodiments, the protection circuit 1410 (e.g., an OCP circuit) may include a first switch (M1) 1716, a second switch (M2) 1715, or a third switch (M3) 1712. A first resistor 1713 and/or a second resistor 1714 may be connected to the third switch (M3) 1712, and the voltage distributed by the first resistor 1713 and the second resistor 1714 may be input to the minus terminal of the first comparator 1711.

The third switch 1711, the first comparator 1711, the first resistor 1713, the second resistor 1714, and the second switch 1715 may serve as an LDO for supplying the externally supplied voltage Vbatt to the bias terminal of the power amplifier. The first comparator 1711, together with the first resistor 1713 and the second resistor 1714, may form a feedback loop by which the voltage transferred from Vbatt to the first switch 1716 may be kept constant. For example, the gate voltage of the third switch 1712 according to Vbatt may be changed through the feedback loop and, as connected in parallel with the gate terminal of the second switch 1715, may be varied in substantially the same manner as the voltage of the second switch 1715. A second comparator 1717 may be connected to the gate terminal of the first switch 1716, and the second comparator 1717 may output a result of comparing the output signal of the second switch 1715 with Vref2. The output signal of the second comparator 1717 and the output signal of the first switch 1716 may be compared by the third comparator 1718, and the result of comparison may be compared with Ref3 by a fourth comparator 1719. For example, when the difference between the result from the second comparator 1717 and Vbatt_PA output from the first switch 1716 is greater than Ref3, the fourth comparator 1719 may output an OCP alarm.

According to various embodiments, when the current flowing from Vbatt to the second switch 1715 or through the first switch 1716 to Vbatt of the power amplifier is in a normal range, the gate bias of the first switch 1716 may be controlled so that the first switch 1716 is a triode region. The second comparator 1717 may be connected with Vref2 and the source terminal of the first switch 1716 and, through the feedback loop, the voltage of the source node of the first switch 1716 may be maintained substantially equal to the gate voltage of the first switch 1716.

According to various embodiments, in a normal situation of the power amplifier, when a voltage difference between the drain terminal Vbatt_PA of the first switch 1716 and Vbatt is a specific threshold (delta) or less, the transistor of the first switch 1716 operates in the triode region, as its operating region, and may thus operate as a resistor. As the current flowing through the first switch 1716 increases, a voltage drop may occur in the Vbatt_PA node portion due to an IR drop.

According to various embodiments, when the voltage difference between the drain terminal Vbatt_PA of the first switch 1716 and Vbatt while the power amplifier is an overcurrent situation is a specific threshold (delta) or more, the transistor of the first switch 1716 operates in a saturation region, as its operating range, and may thus operate like a current source. The current transferred to Vbatt_PA through the source/drain of the first switch 1716 may be determined by the gate voltage of the first switch 1716. According to various embodiments, the threshold (delta) may be adjusted according to a Vref2 condition, and Vref2 may be adjusted by a program through a MIPI register. According to various embodiments, the third comparator 1718, which monitors the difference between the gate voltage a of the first switch 1716 and the drain voltage b of the first switch 1716, is an extractor and transfers the difference a-b between the two voltages to the fourth comparator 1719. The fourth comparator 1719 may compare the output value of the third comparator 1718 with the Ref3 voltage value. As a result of comparison by the fourth comparator 1719, if the difference (a-b) between the two voltages is Ref3 or less, the OCP alarm may be switched from 'low' to 'high' or from '0' to '1' and output.

According to various embodiments, as the protection circuit 1410 is added to each of the first power amplifier 711 and the second power amplifier 721, the two power amplifiers may be effectively protected from damage while securing their performance. According to various embodiments, to prevent further damage to the power amplifier for which the OCP alarm is output as 'high' or '1,' the controller 1300 may identify which power amplifier is damaged and then reinforce the OCP condition by adjusting Vref2.

Figure 18:
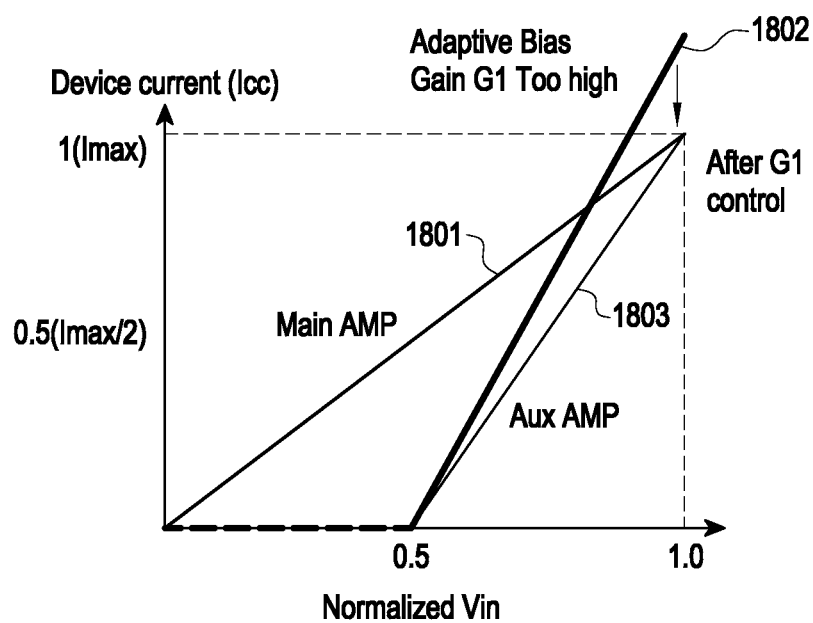
FIG. 18 is a graph illustrating gain adjustment of adaptive bias, according to various embodiments.

FIG. 18 is a graph illustrating gain adjustment of adaptive bias, according to various embodiments.

Referring to FIG. 18, in general, of the two power amplifiers, the second power amplifier 721 (e.g., an auxiliary amplifier or peak amplifier) may be highly likely to be damaged due to an instantaneous bias rise upon high-power operation using an adaptive bias. FIG. 18 shows an input voltage versus current 1801 of the first power amplifier 711 and an input voltage versus current 1802 of the second power amplifier 721. The second power amplifier 721 may be damaged as the adaptive bias control circuit may instantaneously flow a higher current than the target current due to a malfunction in a load condition or an unexpected environment. If a low current flows after the high current instantaneously flows, the current supplied from Vcc fails to flow a low current again, and current flows for a longer time so that a high voltage is applied to the collector terminal of the second power amplifier 721, damaging the second power amplifier 721. In such a case, to prevent damage to the second power amplifier 721, the gain of the adaptive bias control circuit (e.g., the gain of the amplifier 1132) may be adjusted so that it may be normally operated at a relatively lower current which instantaneously flows through the power amplifier 721. For example, as illustrated in FIG. 18, when the gain of the adaptive bias control circuit is relatively too high as denoted with 1802, the second power amplifier 721 may be operated normally as denoted with 1803 by lowering the gain.

Figure 19:
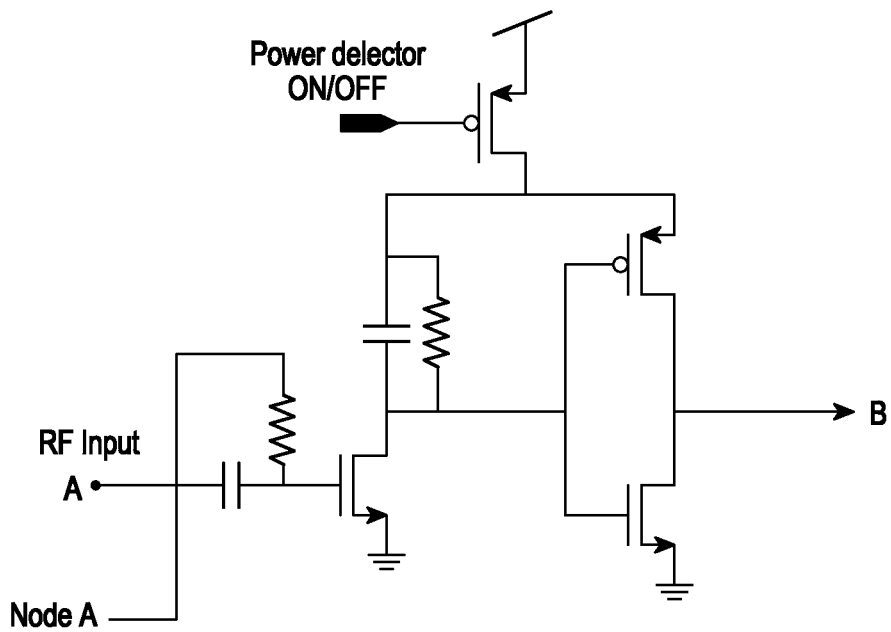
FIG. 19 is a circuit diagram illustrating an adaptive bias circuit according to various embodiments.

FIG. 19 is a circuit diagram illustrating an adaptive bias circuit according to various embodiments.

Figure 20:
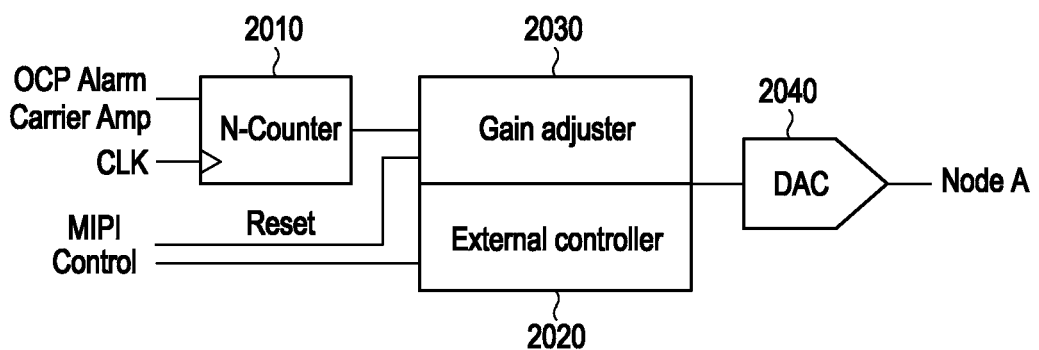
FIG. 20 is a block diagram illustrating control of an adaptive bias circuit according to various embodiments.

Referring to FIG. 19, when an OCP alarm occurs according to various embodiments, an adjusted bias may be input through Node A, as illustrated in FIG. 20, rather than a fixed bias being input as illustrated in FIG. 12B.

FIG. 20 is a block diagram illustrating control of an adaptive bias circuit according to various embodiments.

Referring to FIG. 20, to control the bias of the adaptive bias control circuit 722, a controller 1300 may include an N-counter 2010, a gain adjuster 2030, an external controller 2020, or a digital-to-analog (DA) converter 2040.

In the adaptive bias control circuit of FIG. 12B, the bias value for adjusting the gain of the adaptive bias is fixed. However, if the OCP alarm output from the protection circuit 1410 occurs for a predetermined period (e.g., a time of a predetermined number of times counted by the N-counter 2010), the gain adjuster 2030 may reduce the gain of the adaptive bias control circuit by a set value (e.g., a unit value), thereby adjusting 1802 to 1803 as illustrated in FIG. 18. According to various embodiments, forced gain setting information may be input to the external controller 2020 through a MIPI control signal, or a signal for resetting the adjusted gain may be input to the gain adjuster 2030. It is possible to prevent a recurrence of OCP by the MIPI control signal.

For example, the N-counter 2020 may count the received OCP alarm based on the clock Clk and, if an OCP alarm is received over a preset number of times (e.g., N times) within a time designated based on the clock, the gain adjuster 2030 may adjust the gain of the adaptive bias control circuit to reduce the current value by a unit value. According to various embodiments, the MIPI control signal input to the gain adjuster 2030 or the external controller 2020 may be received from the AP 120 or the CP 260.

According to an embodiment, a power amplification circuit may comprise a power distributor configured to receive a radio frequency (RF) signal and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, and a protection circuit configured to identify a current input to a bias terminal of the second power amplifier and, control a magnitude of the current input to the bias terminal based on the identified input current.

According to various embodiments, the protection circuit may change a setting for a maximum current of the current input to the bias terminal.

According to various embodiments, the protection circuit may include a low drop output (LDO) circuit.

According to various embodiments, the protection circuit may output an alarm signal when the current input to the bias terminal exceeds a set value.

According to various embodiments, the power amplification circuit may further comprise an adaptive bias control circuit to adaptively control the current input to the bias terminal of the second power amplifier based on a power level of the RF signal.

According to various embodiments, the power amplification circuit may further comprise a controller. The controller may receive the alarm signal from the protection circuit and adjust a gain for adjusting a bias current in the adaptive bias control circuit based on the alarm signal.

According to various embodiments, the controller may reduce the gain for adjusting the bias current in the adaptive bias control circuit, by a set value, when the alarm signal exceeds a preset number of times.

According to various embodiments, the controller may adjust the gain for adjusting the bias current in the adaptive bias control circuit based on a control signal received from a processor.

According to various embodiments, the controller may provide a set value for a maximum current of the current input to the bias terminal to the protection circuit.

According to various embodiments, the power distributor may include at least one of a divider or a splitter.

According to various embodiments, the voltage of the first bias may be set to be larger than the voltage of the second bias.

According to various embodiments, the first bias of the first power amplifier may be set to class A or class AB.

According to various embodiments, the second bias of the second power amplifier may be set to class C.

According to an embodiment, a power amplification circuit may comprise a power distributor configured to receive a radio frequency (RF) signal and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, a resistor connected to a bias terminal of the second power amplifier, and a monitoring circuit configured to determine whether the second power amplifier is damaged based on a current measured between both ends of the resistor.

According to various embodiments, the monitoring circuit may output identification information corresponding to the second power amplifier.

According to various embodiments, the power amplification circuit may further comprise a controller. The controller may receive whether the second power amplifier is damaged and the identification information corresponding to the second power amplifier from the monitoring circuit and, when the second power amplifier is determined to be damaged, provide a control signal for controlling a current flowing to a bias terminal of the second power amplifier to the bias terminal of the second power amplifier.

According to an embodiment, an electronic device may comprise a communication processor, an RF circuit configured to modulate a baseband signal output from the communication processor into a radio frequency (RF) signal and output the RF signal, a power distributor configured to receive the RF signal from the RF circuit and output a first RF signal and a second RF signal, a first power amplifier configured to receive the first RF signal from the power distributor and amplify the first RF signal based on a first bias, a second power amplifier configured to receive the second RF signal from the power distributor and amplify the second RF signal based on a second bias, an impedance matching circuit configured to receive the first RF signal amplified by the first power amplifier and the second RF signal amplified by the second power amplifier, and a protection circuit configured to identify a current input to a bias terminal of the second power amplifier and, control a magnitude of the current input to the bias terminal based on the identified input current.

According to various embodiments, the protection circuit may change a setting for a maximum current of the current input to the bias terminal.

According to various embodiments, the protection circuit may include a low drop output (LDO) circuit.

According to various embodiments, the protection circuit may output an alarm signal when the current input to the bias terminal exceeds a set value.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. A power amplification circuitry, comprising:
a power distributor configured to receive a radio frequency (RF) signal and output a first RF signal and a second RF signal;
a first power amplifier connected to the power distributor and configured to receive the first RF signal from the power distributor and amplify the first RF signal based on a first bias;
a second power amplifier connected to the power distributor in parallel with the first amplifier and configured to receive the second RF signal from the power distributor and amplify the second RF signal based on a second bias;
an impedance matching circuitry configured to receive the first RF signal amplified by the first power amplifier and the second RF signal amplified by the second power amplifier; and
a protection circuitry configured to identify a current input to a bias terminal of the second power amplifier and control a magnitude of the current input to the bias terminal based on the current input to the bias terminal exceeding a first set value.

2. The power amplification circuitry of claim 1, wherein the protection circuitry is further configured to change a setting for a maximum current of the current input to the bias terminal.

3. The power amplification circuitry of claim 1, wherein the protection circuitry includes a low drop output (LDO) circuitry.

4. The power amplification circuitry of claim 1, wherein the protection circuitry is further configured to output an alarm signal when the current input to the bias terminal exceeds the first set value.

5. The power amplification circuitry of claim 4, further comprising an adaptive bias control circuitry configured to adaptively control the current input to the bias terminal of the second power amplifier based on a power level of the RF signal.

6. The power amplification circuitry of claim 5, further comprising a controller, wherein the controller is configured to:
receive the alarm signal from the protection circuitry, and
adjust a gain for adjusting a bias current in the adaptive bias control circuitry based on the alarm signal.

7. The power amplification circuitry of claim 6, wherein the controller is further configured to reduce the gain for adjusting the bias current in the adaptive bias control circuitry, by a second set value, when the alarm signal exceeds a preset number of times.

8. The power amplification circuitry of claim 6, wherein the controller is further configured to adjust the gain for adjusting the bias current in the adaptive bias control circuitry based on a control signal received from a processor.

9. The power amplification circuitry of claim 6, wherein the controller is further configured to provide a third set value for a maximum current of the current input to the bias terminal to the protection circuitry.

10. The power amplification circuitry of claim 1, wherein the power distributor includes at least one of a divider or a splitter.

11. The power amplification circuitry of claim 1, wherein a voltage of the first bias is set to be larger than a voltage of the second bias.

12. The power amplification circuitry of claim 1, wherein the first bias of the first power amplifier is set to class A or class AB.

13. The power amplification circuitry of claim 1, wherein the second bias of the second power amplifier is set to class C.

14. A power amplification circuitry, comprising:
a power distributor configured to receive a radio frequency (RF) signal and output a first RF signal and a second RF signal;
a first power amplifier connected to the power distributor and configured to receive the first RF signal from the power distributor and amplify the first RF signal based on a first bias;
a second power amplifier connected to the power distributor in parallel with the first amplifier and configured to receive the second RF signal from the power distributor and amplify the second RF signal based on a second bias;
an impedance matching circuitry configured to receive the first RF signal amplified by the first power amplifier and the second RF signal amplified by the second power amplifier;
a resistor connected to a bias terminal of the second power amplifier; and
a monitoring circuitry configured to determine whether the second power amplifier is damaged based on a current measured between both ends of the resistor.

15. The power amplification circuitry of claim 14, wherein the monitoring circuitry is further configured to output identification information corresponding to the second power amplifier.

16. The power amplification circuitry of claim 15, further comprising a controller, wherein the controller is configured to:
receive whether the second power amplifier is damaged and the identification information corresponding to the second power amplifier from the monitoring circuitry; and
when the second power amplifier is determined to be damaged, provide a control signal for controlling a current flowing to a bias terminal of the second power amplifier to the bias terminal of the second power amplifier.

17. An electronic device, comprising:
a communication processor;
an RF circuitry configured to modulate a baseband signal output from the communication processor into a radio frequency (RF) signal and output the RF signal;
a power distributor configured to receive the RF signal from the RF circuitry and output a first RF signal and a second RF signal;
a first power amplifier connected to the power distributor and configured to receive the first RF signal from the power distributor and amplify the first RF signal based on a first bias;
a second power amplifier connected to the power distributor in parallel with the first amplifier and configured to receive the second RF signal from the power distributor and amplify the second RF signal based on a second bias;

an impedance matching circuitry configured to receive the first RF signal amplified by the first power amplifier and the second RF signal amplified by the second power amplifier; and a protection circuitry configured to identify a current input to a bias terminal of the second power amplifier and control a magnitude of the current input to the bias terminal based on the current input to the bias terminal exceeding a first set value.

18. The electronic device of claim 17, wherein the protection circuitry is further configured to change a setting for a maximum current of the current input to the bias terminal.

19. The electronic device of claim 17, wherein the protection circuitry includes a low drop output (LDO) circuitry.

20. The electronic device of claim 17, wherein the protection circuitry is further configured to output an alarm signal when the current input to the bias terminal exceeds the first set value.

* * * * *